(12) United States Patent
McCullough et al.

(10) Patent No.: US 7,834,106 B2
(45) Date of Patent: Nov. 16, 2010

(54) LIVING SYNTHESIS OF CONDUCTING POLYMERS INCLUDING REGIOREGULAR POLYMERS, POLYTHIOPHENES, AND BLOCK COPOLYMERS

(75) Inventors: Richard D. McCullough, Pittsburg, PA (US); Elena E. Sheina, Pittsburgh, PA (US); Mihaela C. Iovu, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 0 days.

(21) Appl. No.: 12/250,517

(22) Filed: Oct. 13, 2008

(65) Prior Publication Data

US 2009/0043052 A1 Feb. 12, 2009

Related U.S. Application Data

(62) Division of application No. 11/394,202, filed on Mar. 31, 2006, now Pat. No. 7,452,958.

(60) Provisional application No. 60/667,065, filed on Apr. 1, 2005.

(51) Int. Cl.
*C08G 75/06* (2006.01)
*C08G 75/00* (2006.01)
*C08L 81/00* (2006.01)

(52) U.S. Cl. ................... 525/535; 525/417; 525/536; 528/73; 528/377; 528/378; 528/379

(58) Field of Classification Search ................. 525/535, 525/417, 536; 528/73, 377, 378, 379
See application file for complete search history.

(56) References Cited

U.S. PATENT DOCUMENTS 6,166,172 A 12/2000 McCullough et al.
6,602,974 B1 8/2003 McCullough et al.

OTHER PUBLICATIONS

U.S. Appl. No. 60/667,065, McCullough et al., filed Apr. 1, 2005.
Allcock et al., *Contemporary Polymer Chemistry*, Prentice-Hall, 1981, pp. 72-74, 311-317 (1981).
Balsara et al., "Block Copolymers in Nanotechnology", *The Chemistry of Nanostructured Materials*, pp. 317-327 (2003).
Benn, R., et al., Topalovic, I.; Scott, F. *Organometallics*, vol. 8, pp. 2290-2291 (1989).
Billmeyer, Jr., F., "Block and Graft Copolymers", *Textbook of Polymer Science* 3rd ED. pp. 90, 121 (1984).

(Continued)

*Primary Examiner*—Duc Truong
(74) *Attorney, Agent, or Firm*—Foley & Lardner LLP

(57) ABSTRACT

Regioregular poly(3-alkylthiophenes) and other polythiophenes can be prepared by living polymerization which have good solubility, processability and environmental stability. The polymerization method can afford regioregular poly(3-alkylthiophenes) in high yields. Kinetic study of polymerization revealed the living character of this process. The molecular weight of poly(3-alkylthiophenes) is a function of the molar ratio of the monomer to nickel initiator, and conducting polymers with relatively narrow molecular weight distribution (PDI<1.5) are now readily available. Sequential monomer addition resulted in new block copolymers containing different poly(3-alkylthiophene) segments, which further confirms the "livingness" of this system. Other synthetic methods can be used as well to conduct living polymerization. Blends and electronic devices can be prepared.

28 Claims, 27 Drawing Sheets

OTHER PUBLICATIONS

Browning, J., et al., "Synthesis and Crystal Structure of Bis(triethylphosphine)[hexakis-(trifluoromethyl)benzene]platinum, and of a Nickelacycloheptatriene Complex", *J.Chem.Soc.,Chem. Commun.* pp. 31-32 (1973).

Chen, T. A., et al., "Use of Highly Reactive Zinc Leas to a New, Facile Synthesis for Polyarylenes", *Macromolecules*, vol. 26, pp. 3462-3463 (1993).

Chen, T. A., et al., ; 0"The First Regioregular Head-to-Tal Poly(3-hexylthiophene-2,5-diyl) and a Regiorandom Isopolymer: Ni vs Pd Catalysis of 2(5)-Bromo-5(2)-(bromozincio)-3-hexylthiophene Polymerization", *Am. Chem. Soc.*, vol. 114, pp. 10087-10088 (1992).

Chen, T. A., et al., "Regiocontrolled Synthesis of Poly(3-alkylthiophenes) Mediated by Rieke Zinc: Their Characterization and Solid-State Properties"; *J.Am.Chem.Soc.*, vol. 117, pp. 233-244 (1995).

Corriu, R. J. P., et al., Activation of Grignard Reagents by Transition-metal Complexes. A New and Simple Synthesis of *trans*-Stilbenes and Polyphenyls, *J.Chem.Soc.,Chem.Commun.*, vol. 3, p. 144 (1972).

De Paoli, M. A., et al., ; All-polymeric electrochromic and photoelectrochemical devices: new advances, *Electrochim. Acta*, vol. 46, pp. 4243-4249 (2001).

Diederich, F.; Stang, P. J., *Metal-catalyzed Cross-coupling Reactions*. ed.; Wiley-VCH: Wernheim, Germany, 1998.

Francòis et al., "Block-copolymers with conjugated segments: Synthesis and structural characterization", *Synth. Met.*, vol. 69, pp. 463-466 (1995).

Garnier, F., et al., "Molecular Engineering of Organic Semiconductors: Design of Self-Assembly Properties in Conjugated Thiophene Oligomers", *J.Am.Chem.Soc.*, vol. 115, 8716-8721 (1993).

Groenendaal, L. B., et al., "Electrochemistry of Poly(3,4-alkylenedioxythiophene) Derivatives", *Adv. Mater.*, vol. 15, 855-879 (2003).

Hempenius, M., et al., "A Polystyrene-Oligothiophene-Polystyrene Triblock Copolymer", . Am. Chem. Soc., vol. 120, pp. 2798-2804 (1998).

Heuer, H. W., et al., ; W Electronchromic Window Based on Conducting Poly(3,4-ethylenedioxythiophene)-Poly(styrene sulfonate) *Adv.Funct.Mater.*, vol. 12, pp. 89-94 (2002).

Iovu, M. C., et al., "Experimental Evidence for the Quasi-"Living" Nature of the Grignard Metathesis Method for the Synthesis of Regioregular", *Macromolecules*, , vol. 38, pp. 8649-8656 (2005).

Jeffries-El, M.; "In-Situ End-Group Functionalization of Regioregular Poly(3-alkylthiophene) Using the Grignard Metathesis Polymerization Method", *Adv. Mater.*, vol. 16, pp. 1017-1019 (2004).

Jenekhe, S. A., et al., "Self-Assembled Aggregates of Rod-Coil Block Copolymers and Their Solubilization and Encapsulation of Fullerenes", *Science*, vol. 279, pp., 1903-1907 (Mar. 20, 1998).

Katz, H. E., et al., "Organic Transistor Semiconductors" *Accounts of Chemical Research*, vol. 34, No. 5, pp. 359-369 (2001).

Kraft, A., et al., "Electroluminescent Conjugated Polymers-Seeing Polymers in a New Light", *Angew. Chem. Int Ed.*, vol. 37, pp. 402-428 (1998).

Kumada, M., "Nickel and Palladium Complex Catalyzed Cross-Coupling Reactions of Organometallic Reagents With Organic Halides", *Pure Appl. Chem.*, vol. 52, pp. 669-679 (1980).

Li, w., et al., "Syntheses of Oligophenylenevinylenes-Polyisoprene Diblock Copolymers and Their Microphase Separation", *Macromolecules*, vol. 32, pp. 3034-3044 (1999).

Liu, J., et al., "Tuning the Electrical Conductivity and Self-Assembly of Regioregular Polythiophene by Blcok Copolymerizatio: nanowire Morphologies in New Di- and Triblock Copolymers", *Angew. Chem. Int. Ed.*, vol. 41, No. 2, pp. 329-332 (2002).

Liu, J., et al., "End Group Modification of Regioregular Polythiophene through Postpolymerization Functionalization", *Macromolecules*, vol. 35, pp. 9882-9889 (2002).

Lowe, R. S., et al., "Regioregular, Head-to-Tail Coupled Poly(3-alkylthiophenes) Made Easy by the GRIM Method: Investigation of the Reaction and the Origin of Regioselectivity", *Macromolecules*, vol. 34, pp. 4324-4333 (2002).

Lowe, R. S., et al., "A Simple Method to Prepare Head-to-Tail Coupled Poly(3-alkylthiophenes) Using Grignard Metathesis", *Adv. Mater.*, vol. 11, p. 250-253 (1999).

McCullough, R. D., et al., "Regioregular, Head-to-Tail Coupled Poly(3-alkylthiophene) and Its Derivatives", *Handbook of Conducting Polymers*, $2^{nd}$ Ed., Chapter 9, pp. 225-258 (1998).

McCullough, R. D., "The Chemistry of Conducting Polythiophenes" *Adv. Mater.*, No. 2, pp. 93-116 (1998).

McCullough, R. D., et al., Enhanced Electrical Conductivity in Regioselectively Synthesized Poly(3-alkylthiophenes), *J.Chem. Soc. Chem. Commun.*, pp. 70-72 (1992).

McCullough, R. D.; et al., Design, Synthesis, and Control of Conducting Polymer Architectures: Structurally Homogeneous Poly(3-alkylthiophenes), *J. Org. Chem.* vol. 58, pp. 904-912 (1993).

McCullough, R. D.; et al., "Synthesis and Physical Properties of Regiochemically Well-Defined, Head-To-Tail Coupled Poly(3-Alkythiophenes)", *Synth.Met.*, vol. 55, pp. 1198-1203 (1993).

McCullough, R. D., et al., "The First Synthesis and New Properties of Regioregular, Head-To-Tail Coupled Polythiophenes", *Synth.Met.*, vol. 67, pp. 279-282 (1995).

Morrell, D. G., et al., "Mechanistic Studies of Nickel Catalysis in the Cross Coupling of Aryl Halides with Alkylmetals. The Role of Arylalkylnickel(II) Species as Intermediates", *J. Am. Chem. Soc.*, vol. 97, pp. 7262-7270 (1975).

Nalwa, H. S., *Handbook of Organic Conductive Molecules and Polymers*. ed.; J.Wiley &Sons: New York, 1996.

Negishi, E., "Palladium- or Nickel-Catalyzed Cross Coupling. A New Selective Method for Carbon-Carbon Bond Formation", *Acc. Chem. Res.*, vol. 15, pp. 340-348 (1982).

Negishi, E., et al., "Palladium- or Nickel-Catalyzed Reactions of Alkenylmetals with Unsaturated Organic Halides as a Selective Route to Arylated Alkenes and Conjugated Dienes: Scope, Limitations, and Mechanism", *J. Am. Chem. Soc.*, vol. 109, pp. 2393-2401 (1987).

Noshay, A., et al., *Block Copolymers, Overview and Critical Survey*, by Academic Press, 1977.

Ozawa, F., et al., "Mechanism of reaction of *trans*-diarylbis(diethylphenylphosphine) palladium(II) complexes with aryl iodides to give biaryls", *J. Organomet.Chem.*, vol. 330, 00-263 (1987).

Parshall, G. W., "Aryl Compounds of Nickel, Palladium, and Platinum. Synthesis and Bonding Studies", *J. Am. Chem. Soc.*, vol. 96, pp. 2360-2366 (1974).

Roncali, J., "Conjugated Poly(thiophenes): Synthesis, Functionalization, and Applications", *Chem. Rev.*, vol. 92, pp. 711-738 (1992).

Schopf, G., et al., "*Polythiophenes: Electrically Conductive Polymers*", Springer: Berlin, 1997.

Scott, F., et al., Preparation of new nickel(0) naphthalene complexes, crystal structure of $[Ni(C_{10}H_8)(i-C_3H_7)_2PCH_2CH_2P(i-C_3H_7)_2]$, C.; Betz, P. *J.Organomet.Chem.*, vol. 387, pp. 113-121 (1990).

Sheina, E. E., et al., "Chain Growth Mehanism for Regioregular Nickel-Initiated Cross-Coupling Polymerizations", *Macromolecules*, vol. 37, pp. 3526-3528 (2004).

Shinar, J., *Organic Light-Emitting Devices—A Survey*, Springer-Verlag, 2 , Dec. 2003.

Skotheim, T., *Handbook of Conducting Polymers*. ed.; Marcel Dekker: New York, 1986.

Skotheim, T.; Reynolds, J.; Elsembauer, R., *Handbook of Conducting Polymers*. ed.; Marcel Dekker: New York, 1998.

Smith, G., et al., ,,Reductive Elimination From Organometals. Thermal and Induced Decomposition of Arylmethylnickel(II) Complexes, *J.Organomet. Chem.*, vol. 198, pp. 199-214 (1980).

Tamao, K.; et al.,"*Selective Carbon-Carbon Bond Formation by Cross-Coupling of Grignard Reagents with Organic Halides. Catalysis by Nickel-Phosphine Complexes*", Am. Chem. Soc. 1972, vol. 94, pp. 4374-.

*The Encyclopedia of Polymer Science and Engineering*, Wiley, 1990, pp. 298-300.

Tsou, T. T., et al., "Mechanism of Oxidative Addition. Reaction of Nickel(0) Complexes with Aromatic Halides", *J. Am. Chem. Soc.* 1979, vol. 101, pp. 6319-6332 (1979).

Wang, H., et al., "Syntheses of Amphiphilic Diblock Copolymers Containing a Conjugated Block and Their Self-Assembling Properties", *J. Am. Chem. Soc.*, vol. 122, pp. 6855-6861 (2000).

Widawski, G., et al., "Self-organized honeycomb morphology of star-polymer polystyrene films", *Nature (London)*, vol. 369, pp. 387-389 (Jun. 2, 1994).

Yamamoto, A., et al., "Chemistry of organopalladium and nickel complexes relevant to catalysis", *Pure Appl. Chem.*, vol. 57, No. 12, 1799-1808 (1985).

Yamamoto, T., et al, "Mechanism of C-C coupling of reactions of aromatic halides, promoted by Ni(COD)$_2$ in the presence of 2,2'-bipyridine and PPh$_3$, *to give biaryls*", *J.Organomet.Chem.*, vol. 428, pp. 223-237 (1992).

Yang, Z., et al., "A Soluble Blue-Light-Emitting Polymer", *Macromolecules*, vol. 26, pp. 1188-1190 (1993).

Yokoyama, A., et al.,"Chain-Growth Polymerization for Poly(3-hexylthiophene) with a Defined Molecular Weight and a Low Polydispersity", *Macromolecules*, vol. 37, pp. 1169-1171 (2004).

Yokozawa et al., "Chain-Growth Polycondensation: Living Polymerization nature in Poly-condensation and Approach to Condensation Polymer Architecture", *Polymer Journal*, vol. 36, No. 2, pp. 65-83 (2004).

Yue, S., et al., Intermolecular Association and Supramolecular Organization in Dilute Solution. 1. Regioregular Poly(3-dodecylthiophene), *Macromolecules*, vol. 29, pp. 933-939 (1996).

LIVING SYNTHESIS OF CONDUCTING POLYMERS INCLUDING REGIOREGULAR POLYMERS, POLYTHIOPHENES, AND BLOCK COPOLYMERS

RELATED APPLICATIONS

This is the divisional application of U.S. application Ser. No. 11/394,202 filed Mar. 31, 2006 now U.S. Pat. No. 7,452,958, which claims priority to U.S. provisional application Ser. No. 60/667,065 filed Apr. 1, 2005, and is hereby incorporated by reference in its entirety.

FEDERAL RIGHTS

This work was carried out with support from the Federal government grants NSF CHE-0107178 and NSF CHE-0415369. The government reserves certain rights in the invention.

BACKGROUND

Conventional design of advanced organic materials that display a variety of desirable properties in a controllable way continues to be one of the great challenges of the contemporary research. Since the initial discovery of organic conducting polymers in the late 1970s, various applications of these materials have been explored due to their exceptional electronic and photonic properties.[1-3]

Polythiophenes (PTs) continue to be one of the most versatile and extensively studied conjugated polymer systems due to their exceptional spectroscopic and electronic properties. The straightforward synthesis of PT derivatives generates soluble and processable polymers with a wide range of practical applications, e.g., rechargeable batteries,[1] electrochromic devices (ECDs),[1] chemical and optical sensors,[1] light-emitting diodes (LEDs),[4-6] and field-effect transistors (FETs).[7] While traditional approaches to synthesize PTs derivatives via electrochemical or oxidative chemical polymerization methods yield polymers with various degrees of regioregularity,[3] regioselective synthesis of poly(3-alkylthiophenes) (PATs) that contain almost exclusively head-to-tail (HT) couplings result in improved electrical conductivities and a greater effective conjugation length.

Synthesis of regioregular PATs, first discovered by McCullough et al.[8,9] and followed by others,[10] results in the formation of defect-free, structurally homogeneous HT-PATs with greatly improved electronic and photonic properties over regiorandom analogues.[11,12] Environmental stability can be good. The main difficulty of the original methods lies in the preparation of highly pure 2-bromo-3-alkyl-5-bromomagnesiothiophene.[8] This complication has been overcome with the discovery of the Grignard Metathesis (GRIM) method which offers a quick and cost effective technique for the large scale synthesis of high molecular weight, regioregular PATs.[13,14]

All of the aforementioned polymerizations are metal-catalyzed cross-coupling reactions.[15] The development of efficient catalysts has enormously expanded the scope of these polymerization reactions, where nickel and palladium catalysts with tailored phosphine ligands have been applied. The course of the catalytic reaction has been extensively studied and has been proved to be affected by the ligand structure and the choice of the metal.[15]

While the mechanism for the Ni(II) catalyzed cross-coupling reaction (which in some formulations involves a catalytic cycle of three consecutive steps: oxidative addition, transmetalation, and reductive elimination) has been investigated, it continues to remain a subject of investigation.[16-26]

The discovery of nickel-catalyzed aryl-aryl bond formations of Grignard reagents with organohalides by Kumada[16,17] and Corriu[30] has led to a significant development in the synthesis of various types of thiophenes. Consequently, the Kumada reaction has been applied to the synthesis of oligothiophenes and polythiophenes. Despite its use, the mechanism of the nickel-catalyzed cross-coupling polymerization has not been fully understood. Historically, there are three different mechanistic pathways that were independently proposed.[16-26] The most plausible mechanistic pathway, which was later extended to cross-coupling polycondensation,[31,32] was suggested by Negishi,[18,19] Yamamoto,[20-22] and Parshall.[23] It has been proposed that the reductive elimination and oxidative addition were step-wise processes, which involved formation of a "free" Ni(0) intermediate, with the transmetalation as the rate-determining step. The experimental observations from both McCullough and Grignard metathesis methods invalidated the generally accepted mechanism for the nickel-catalyzed cross-coupling polymerization for the synthesis of regioregular poly(3-alkylthiophenes).

"Living" polymerizations have attracted a great deal of attention due to the fact that they afford polymers with predetermined molecular weights, low polydispersities, specific functionalities and various architectures including block copolymers. See, e.g., Billmeyer, *Textbook of Polymer Science,* 3$^{rd}$ Ed. John Wiley, 1984, pages 90, 121 and references cited therein; Allcock et al., *Contemporary Polymer Chemistry,* Prentice-Hall, 1981, pages 72-74, 311-317. These attributes are important for conductive polymers. For example, it is important to have access to regioregular poly (3-alkylthiophenes) and other polythiophenes, including soluble polythiophenes and block copolymers, with controlled molecular weights because the conductivities and other important properties depend on the conjugation length, i.e., on the number of the monomer units incorporated into the polymer. This can result in the ability to tune the electrical conductivity, thereby allowing for the design of materials which are tailor made for specific applications in electronics. One group has recently reported chain growth studies for GRIM metathesis polymerization (Yokoyama et al., *Macromolecules,* 37, 1169-1171, 2004). However, the monomer employed is not most suitable for commercialization. A need exists, however, to develop alternative controlled polymerization methods and better block copolymers. Commercially useful ingredients and conditions are desired.

SUMMARY

Multiple embodiments of the inventions can be employed. One embodiment is a method comprising: (i) combining a soluble thiophene monomer having a 3-alkyl substituent with an amide base and a divalent metal halide to form a modified thiophene monomer; and (ii) polymerizing the modified monomer at a first molar concentration $[M]_0$ in the presence of a transition metal complex polymerization initiator at a second molar concentration [I] under conditions to form regioregular poly(3-alkylthiophene), wherein at the start of polymerization the ratio of first molar concentration for monomer: second molar concentration for initiator is about 125:1 or less.

Another embodiment is a method comprising: (i) combining a soluble thiophene monomer having a 3-substituent with an amide base and a divalent metal halide to form a modified thiophene monomer having a 3-substituent, (ii) polymerizing the modified monomer at a first molar concentration $[M]_0$ in the presence of a transition metal complex polymerization initiator at a second molar concentration $[I]$ under conditions to form regioregular polythiophene having a 3-substituent, wherein the polymerization is carried out under conditions which provides a degree of polymerization which can be substantially predicted based on the first and second molar concentrations.

Another embodiment is a method comprising: (i) polymerizing a first thiophene monomer by Grignard metathesis polymerization to form a polythiophene intermediate under conditions which provide for living polymerization, (ii) chain extending the intermediate with addition of a second thiophene monomer to form an AB block copolymer.

To provide a more attractive commercial process, the thiophene monomer can have two bromo leaving groups rather than one bromo and one iodo leaving group.

Still further, another embodiment is a composition comprising: an AB block copolymer, wherein the A block is a regioregular polythiophene, and the B block is also a regioregular polythiophene.

Another embodiment is a composition comprising: an ABA block copolymer, wherein the A block is a regioregular polythiophene and the B block is also a regioregular polythiophene.

Another embodiment is a composition comprising: an ABC block copolymer, wherein the A block is a regioregular polythiophene, wherein the B block is also a regioregular polythiophene, and wherein the C block is also a regioregular polythiophene.

Advantages of these and other embodiments include better control of polymerization, better control of polymer microstructure, and better polymer properties. In addition, good commercial prospects can be found by appropriate selection of monomer.

DETAILED DESCRIPTION

Figure 1:
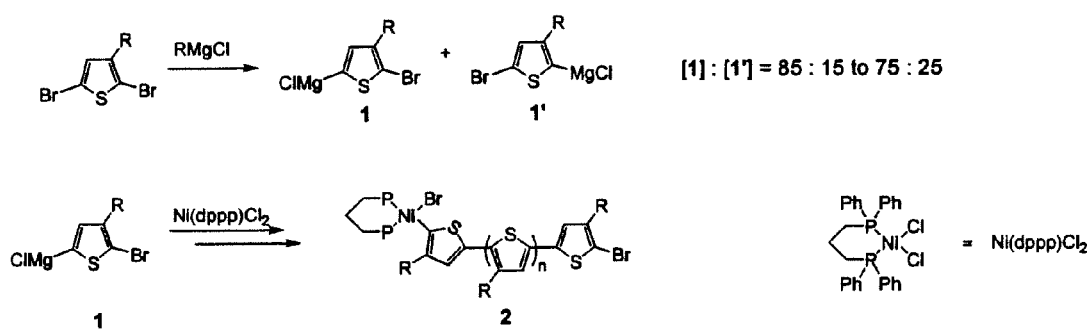
FIG. 1. Grignard metathesis method for the synthesis of regioregular poly(3-alkylthiophene).

Priority U.S. provisional application Ser. No. 60/667,065 filed Apr. 1, 2005 to McCullough et al., is hereby incorporated by reference in its entirety. Moreover, Iovu et al., *Macromolecules,* 2005, 38, 8649-8656, is hereby incorporated by reference including the experimental part, the figures, the results and discussion, and references and notes section.

All references cited herein are hereby incorporated by reference in their entirety.

The invention can encompass methods of making polymers, including block copolymers, as well as polymeric compositions, and compositions comprising block copolymers.

For introduction, technical literature can be used in the practice of the present invention including the following.

U.S. Pat. No. 6,602,974 to McCullough et al. describes one system of block copolymers prepared by use of tailored endgroups and is incorporated by reference in its entirety including for its description of devices, synthetic methods, and block copolymers including both conductive and non-conductive segments. See also, Liu et al., *Macromolecules,* 2002, 35, 9882-9889; Liu et al., *Angew. Chem. Int. Ed.,* 2002, 41, No. 2, pages 329-332, which are incorporated by reference in their entirety. These references also describe important morphological aspects of block copolymers including the formation of nanowires.

U.S. Pat. No. 6,166,172 to McCullough et al. describes an improved method for synthesis of conducting polymers (GRIM methods) including larger scale methods and is hereby incorporated by reference in its entirety. See also Loewe et al., *Macromolecules,* 2001, 34, 4324-4333 which describes regioselectivity of these reactions.

Chemistry and applications for conductive polymers, as described herein, can be further found in for example (i) McCullough, *Adv. Mater.,* 1998, No. 2, pages 93-116, (ii) McCullough et al., *Handbook of Conducting Polymers,* 2$^{nd}$ Ed., 1998, Chapter 9, pages 225-258.

In addition, electrically conductive polymers are described in *The Encyclopedia of Polymer Science and Engineering,* Wiley, 1990, pages 298-300, including polyacetylene, poly (p-phenylene), poly(p-phenylene sulfide), polypyrrole, and polythiophene, which is hereby incorporated by reference in its entirety. This reference also describes blending and copolymerization of polymers, including block copolymer formation.

Polythiophenes are described, for example, in Roncali, J., *Chem. Rev.* 1992, 92, 711; Schopf et al., *Polythiophenes: Electrically Conductive Polymers,* Springer: Berlin, 1997.

Polymeric semiconductors are described in, for example, "Organic Transistor Semiconductors" by Katz et al., *Accounts of Chemical Research,* vol. 34, no. 5, 2001, page 359 including pages 365-367, which is hereby incorporated by reference in its entirety.

Polymerization of polythiophenes and block copolymers for other types of non-thiophene polymers are described in, for example, Yokozawa et al., *Polymer Journal,* Vol. 36, no. 2, pp. 65-83 (2004).

Block copolymers are generally known in the art. See for example Yang (Ed.), *The Chemistry of Nanostructured Materials,* 2003, pages 317-327 ("Block Copolymers in Nanotechnology"). Also block copolymers are described in, for example, *Block Copolymers, Overview and Critical Survey,* by Noshay and McGrath, Academic Press, 1977. For example, this text describes A-B diblock copolymers (chapter 5), A-B-A triblock copolymers (chapter 6), and -(AB)$_n$-multiblock copolymers (chapter 7), which can form the basis of block copolymer types in the present invention. Additional block copolymers including polythiophenes are described in, for example, Francois et al., *Synth. Met.* 1995, 69, 463-466, which is incorporated by reference in its entirety; Yang et al., *Macromolecules* 1993, 26, 1188-1190; Widawski et al., *Nature (London),* vol. 369, Jun. 2, 1994, 387-389; Jenekhe et al., *Science,* 279, Mar. 20, 1998, 1903-1907; Wang et al., *J. Am. Chem. Soc.* 2000, 122, 6855-6861; Li et al., *Macromolecules* 1999, 32, 3034-3044; Hempenius et al., *J. Am. Chem. Soc.* 1998, 120, 2798-2804.

These and other references cited in this application can be used in the practice of the present invention.

In addition, the block copolymers can comprise the conductive block, having conjugated structures which may or may not be doped, and the nonconductive block. The nonconductive block can include a variety of synthetic polymers including condensation, addition, and ring-opened polymers including for example, urethanes, polyamides, polyesters, polyethers, vinyl polymers, aromatic polymers, aliphatic polymers, heteroatom polymers, siloxanes, acrylates, methacrylates, phosphazene, silanes, and the like. Inorganic and organic polymers can be used as the non-conductive part.

If desired, the block copolymers can be blended with other components including inorganic glasses and metals as well as other polymers including inorganic polymers and organic polymers, as well as other conducting polymers either of the same type (e.g., two polythiophene types) or of different type (e.g., a polythiophene with a nonpolythiophene). The block copolymer can be used as a compatibilizing agent.

The conducting polymer can be, for example, a polyacetylene, a polyphenylene, a polythiophene, a polyaniline, a polypyrrole, or a polyphenylene vinylene. In particular, the conducting polymer can be, for example, a polythiophene, optionally substituted at the 3-position, at the 4-position, or both. The conducting polymer can be, for example, a polythiophene with alkyl, aryl, alkoxy, aryloxy, ether, polyether, or heteroatomic subsituents. In particular, the conducting polymer can be a regioregular polythiophene, and more particularly, the conducting polymer can be a regioregular poly (3-alkylthiophene). The amount of regioregularity can be, for example, at least about 95% or at least about 98%. The conducting polymer can be a regioregular poly(3-alkylthiophene), in particular, wherein the alkyl group has 4 to 18 carbons, or alternatively, 4 to 12 carbons.

The conducting polymer can be a copolymer including, for example, a random, gradient, or block copolymer.

The conducting polymer can have a number average molecular weight of about 100,000 or less, or a number average molecular weight of about 50,000 or less, or alternatively, a number average molecular weight of about 25,000 or less, or alternatively, a number average molecular weight of about 10,000 or less, or alternatively, a number average molecular weight of about 5,000 or less.

A variety of polymerization methods can be carried out in the present invention.

For example, one embodiment is a method comprising: (i) combining a soluble thiophene monomer having a 3-alkyl substituent with an amide base and a divalent metal halide to form a modified thiophene monomer; and (ii) polymerizing the modified monomer at a first molar concentration $[M]_0$ in the presence of a transition metal complex polymerization initiator at a second molar concentration $[I]$ under conditions to form regioregular poly(3-alkylthiophene), wherein at the start of polymerization the ratio of first molar concentration for monomer: second molar concentration for initiator is about 125:1 or less. The ratio can be, for example, 100:1 or less, 90:1 or less, 80:1 or less, 70:1 or less, 60:1 or less, or 50:1 or less. If desired, the method can further comprise chain extending the regioregular poly(3-alkylthiophene) with addition of a second thiophene monomer to form an AB block copolymer.

Another embodiment is a method comprising: (i) combining a soluble thiophene monomer having a 3-substituent with an amide base and a divalent metal halide to form a modified thiophene monomer having a 3-substituent, (ii) polymerizing the modified monomer at a first molar concentration $[M]_0$ in the presence of a transition metal complex polymerization initiator at a second molar concentration [I] under conditions to form regioregular polythiophene having a 3-substituent, wherein the polymerization is carried out under conditions which provides a degree of polymerization which can be substantially predicted based on the first and second molar concentrations.

Still further, another embodiment is a method comprising: (i) polymerizing a first thiophene monomer by Grignard metathesis polymerization to form a polythiophene intermediate under conditions which provide for living polymerization, (ii) chain extending the intermediate with addition of a second thiophene monomer to form an AB block copolymer.

The polymerization can be carried out at about 0° to about 50° C., or alternatively, at about 10° to about 40° C.

The initiator can comprise an organometallic compound or a transition metal complex. For example, the initiator can be a nickel, platinum, or palladium compound. Nickel(II) complexes can be used. The intiator, for example, can be a nickel (II)diphosphinohalogeno complex.

In a preferred embodiment, the conducting polymer is a polythiophene and the initiator is an organometallic compound or a transition metal complex. In another preferred embodiment, the conducting polymer is a regioregular polythiophene and the initiator is a nickel compound. In another preferred embodiment, the conducting polymer is a polythiophene having a number average molecular weight of about 50,000 or less and the initiator is an transition metal compound. Another embodiment comprises a regioregular polythiophene substituted in the 3-position and having a number average molecular weight of about 10,000 or less and the initiator is an organometallic nickel(II) compound.

The first molar concentration can be about 1 M or less, or alternatively, about 0.5 M or less, or alternatively, about 0.1 M or less.

Preferably, the polymerizing provides regioregular poly(3-alkylthiophene). Preferably, the polymerizing provides regioregular poly(3-alkylthiophene), wherein the ratio is about 80:1 or less, wherein the first molar concentration is about 1 M or less, and wherein the initiator is a nickel(II) complex. Preferably, the polymerizing can provide regioregular poly (3-alkylthiophene), wherein the ratio is about 50:1 or less, wherein the alkyl group comprises 4 to 12 carbons, and wherein the first molar concentration is about 0.5 M or less. Preferably, the polymerizing also provides regioregular poly (3-alkylthiophene), wherein the ratio is about 50:1 or less, wherein the first molar concentration is about 0.5 M or less, and wherein the initiator is a nickel(II) complex. Preferably, the polymerizing is carried out at a temperature of about 0° C. to about 50° C., wherein the initiator is a nickel(II) complex, and wherein the alkyl group comprises 4 to 18 carbons. Preferably, the first molar concentration is about 0.5 M or less, wherein the ratio is about 100:1 or less, and wherein the initiator is a Ni(II)diphosphinohalogen complex. Preferably, the ratio is about 50:1 or less, wherein the first molar concentration is about 0.1 or less, and wherein the initiator is a nickel(II) complex. Preferably, the ratio is about 50:1 or less, wherein the first molar concentration is about 0.1 or less, wherein the initiator is a nickel(II)diphosphinohalogen complex, wherein the alkyl group comprises 4 to 12 carbons, and wherein the polymerizing is carried out at a temperature of about 10° C. to about 40° C.

Another embodiment is a method comprising: polymerizing 3-alkylthiophene monomer by Grignard metathesis polymerization at a first molar concentration $[M]_0$ in the presence of an organometallic polymerization initiator at a second molar concentration [I] under conditions to form regioregular poly(3-alkylthiophene), wherein the polymerization is carried out under conditions which provides a degree of polymerization which can be predicted based on the first and second molar concentrations. This can be followed by chain extension. Preferably, the alkyl group comprises 4 to 18 carbons, or alternatively, 4 to 12 carbons. Preferably, the polymerizing is carried out at a temperature of about 0° C. to about 50° C. Preferably, the ratio $[M]_0$:[I] is about 136:1 or less. Preferably, the first molar concentration is about 1 M or less. Preferably, the initiator is a nickel(II) complex. Preferably, the polymerizing provides regioregular poly(3-alkylthiophene). Preferably, the polymerizing provides regioregular poly(3-alkylthiophene), wherein the initiator is a nickel(II) diphosphinohalogen complex, wherein the ratio $[M]_0$:[I] is about 80:1 or less, and wherein the first molar concentration is about 0.5 M or less. Preferably, the polymerizing provides regioregular poly(3-alkylthiophene), wherein the alkyl group comprises 4 to 12 carbons, wherein the polymerizing is carried out at a temperature of about 10° C. to about 40° C., and wherein the initator is a nickel(II) complex. Preferably, the polymerizing provides regioregular poly(3-alkylthiophene), wherein the first molar concentration is about 0.1 M or less and the ratio $[M]_0$:[I] is about 50:1 or less, and the polymerizing is carried out at a temperature of about 10° C. to about 40° C.

Another embodiment is a method comprising: polymerizing a thiophene monomer by Grignard metathesis polymerization under conditions which provide for living polymerization, wherein the thiophene monomer is optionally substituted at the 3-position, the 4-position, or both. The polymer can be chain extended. Preferably, the conditions comprise 3-alkylthiophene monomer at a first molar concentration $[M]_0$ in the presence of an organometallic polymerization initiator at a second molar concentration [I] under conditions to form regioregular poly(3-alkylthiophene), wherein at the start of polymerization the ratio $[M]_0$:[I] is about 136:1 or less. Preferably, the conditions comprise 3-alkylthiophene monomer at a first molar concentration $[M]_0$ in the presence of a transition metal complex polymerization initiator at a second molar concentration [I] under conditions to form regioregular poly(3-alkylthiophene), wherein the polymerization provides a degree of polymerization which can be predicted based on the first and second molar concentrations. Preferably, the conditions comprise use of a nickel(II) initiator. Preferably, the conditions comprise polymerizing at about 0° C. to about 50° C. Preferably, the conditions comprise an initial concentration of monomer of about 1 M or less. Preferably, the conditions comprise use of a nickel(II) initiator, polymerizing at about 0° C. to about 50° C., and an initial concentration of monomer of about 1 M or less. Preferably, the alkyl group comprises 4 to 18 carbons. Preferably, the polymerizing provides regioregular poly(3-alkylthiophene). Preferably, the polymerizing provides regioregular poly(3-alkylthiophene), wherein the conditions comprise use of a nickel(II) initiator, polymerizing at about 10° C. to about 40° C., and an initial concentration of monomer of about 1 M or less, and wherein the alkyl group comprises 4 to 12 carbons.

Another embodiment is a method comprising: polymerizing a first thiophene monomer by Grignard metathesis polymerization to form a polythiophene intermediate under conditions which provide for living polymerization, and chain extending the intermediate with addition of a second thiophene monomer to form an AB block copolymer. Preferably, the method provides further chain extending the AB block copolymer with a third thiophene monomer which optionally is the same as the first thiophene monomer. Preferably, the method further provides chain extending the AB block copolymer to form an ABA copolymer. Preferably, the first thiophene monomer, the second thiophene monomer, or both are substituted at the 3-position, the 4-position, or both. Preferably, the method further comprises the steps of chain extension to form ABC block copolymer. Preferably, the first thiophene monomer, the second thiophene monomer, or both are substituted in the 3-position, the 4-position, or both. Preferably, the polymerizing is carried out with a initial monomer: initiator molar ratio of about 140:1 or less. Preferably, the polymerizing is carried out with an initial monomer:initiator molar ratio of about 80:1 or less. Preferably, the polymerizing is carried out at about 0° C. to about 50° C., and wherein the AB block copolymer is a regioregular polythiophene block copolymer. Preferably, the AB block copolymer is a regioregular polythiophene block copolymer.

Another embodiment is a composition comprising: an AB block copolymer, wherein the A block is a regioregular polythiophene, and the B block is also a regioregular polythiophene. The regioregular polythiophene can be, for example, at least 90% regioregular, or at least 95% regioregular, or at least 98% regioregular. Preferably, the A block and/or the B block regioregular polythiophene is substituted at the 3-position, at the 4-position, or both. Preferably, the A block and/or the B block regioregular polythiophene is substituted at the 3-position. Preferably, the A block and/or the B block regioregular polythiophene is substituted at the 4-position. Preferably, the A block and/or the B block regioregular polythiophene is substituted at the 3-position and the 4-position. Preferably, the AB block copolymer has a number average molecular weight of about 25,000 or less. Preferably, the AB block copolymer has a polydispersity of about 2.0 or less. Preferably, the AB block copolymer has a polydispersity of about 1.5 or less. Preferably, the AB block copolymer is soluble, including soluble in organic solvents. Preferably, the AB block copolymer is soluble, wherein the AB block copolymer has a number average molecular weight of about 25,000 or less, and wherein the AB block copolymer has a polydispersity of about 1.5 or less. Preferably, the A block and/or the B block regioregular polythiophene is substituted at the 3-position, at the 4-position, or both, and wherein the AB block copolymer is soluble, wherein the AB block copolymer has a number average molecular weight of about 25,000 or less, and wherein the AB block copolymer has a polydispersity of about 1.5 or less.

Another embodiment is a composition comprising: an ABA block copolymer, wherein the A block is a regioregular polythiophene and the B block is also a regioregular polythiophene. Preferably, the A block and/or the B block regioregular polythiophene is substituted at the 3-position, at the 4-position, or both. Preferably, the A block and/or the B block regioregular polythiophene is substituted at the 3-position. Preferably, the A block and/or the B block regioregular polythiophene is substituted at the 4-position. Preferably, the A block and/or the B block regioregular polythiophene is substituted at the 3-position and the 4-position. Preferably, the AB block copolymer has a number average molecular weight of about 25,000 or less. Preferably, the AB block copolymer has a polydispersity of about 1.5 or less. Preferably, the AB block copolymer is soluble. Preferably, the AB block copolymer is soluble, wherein the AB block copolymer has a number average molecular weight of about 25,000 or less, and wherein the AB block copolymer has a polydispersity of about 1.5 or less. Preferably, the A block and/or the B block regioregular polythiophene is substituted at the 3-position, at the 4-position, or both, and wherein the AB block copolymer is soluble, wherein the AB block copolymer has a number average molecular weight of about 25,000 or less, and wherein the AB block copolymer has a polydispersity of about 1.5 or less.

Another embodiment is a composition comprising: an ABC block copolymer, wherein the A block is a regioregular polythiophene, wherein the B block is also a regioregular polythiophene, and wherein the C block is also a regioregular polythiophene.

The polymers can be used in doped or undoped form. Doping can be ambient doping. Doping can be controlled to vary conductivity from insulating, to semiconductive, to fully conductive. Doping time can be varied to provide the desired doping level. Conductivities greater than $10^{-5}$ S/cm can be achieved. If desired, conductivities greater than 10 S/cm can be achieved. The amount of block copolymer non-conductive component, and/or the amount of non-conductive blend component can be varied to help control conductivity and provide suitable balance of conductivity and material properties for a given application.

Applications:

The applications of these materials are not particularly limited but include optical, electronic, energy, biomaterials, semiconducting, electroluminescent, photovoltaic, LEDs, OLEDs, PLEDs, sensors, transistors, field effect transistors, batteries, flat screen displays, organic lighting, printed electronics, nonlinear optical materials, dimmable windows, RFID tags, fuel cells, and others. See for example Kraft et al., *Angew. Chem. Int Ed.*, 1998, 37, 402-428 and discussion of applications which is hereby incorporated by reference in its entirety. See also, Shinar, *Organic Light-Emitting Devices*, Springer-Verlag, 2004. See also '974 patent noted above. Hole-injection layers can be fabricated. Multilayer structures can be fabricated and thin film devices made. Thin films can be printed. Patterning can be carried out. Printing on consumer products can be carried out. Small transistors can be fabricated. In many applications, the composition is formulated to provide good solution processing and thin film formation. Blends with other polymers including conductive polymers can be prepared. The nanowire morphology of the block copolymers can be exploited in nanoscale fabrication.

The invention is further described with use of the following non-limiting working examples including also a description of polymerization mechanism and examination thereof with use of working examples.

Nickel-initiated cross-coupling polymerization of thiophenes can proceed via a chain-growth mechanism.[27,28] In particular, the reference to Sheina, E. E.; Liu, J.; Iovu, M. C.; Laird, D. W.; McCullough, R. D. *Macromolecules* 2004, 37, 3526-3528 is incorporated by reference in its entirety including the figures, the experimental section, citations to references, and the supplementary material. Furthermore, if desired, the addition of various Grignard reagents (R'MgX) at the end of polymerization can result in the end-capping of regioregular PATs with an R' end group.[29]

The Sheina et al. *Macromolecules* paper describes the mechanism of the nickel initiated cross-coupling polymerization for the synthesis of regioregular poly(3-alkylthiophene) (see FIG. 23).[27] A simplified reaction scheme also is given here (FIG. 1). Treatment of 2,5-dibromo-3-alkylthiophene with 1 equiv of RMgCl (R=alkyl) results in magnesium-bromine exchange reaction, also referred as Grignard Metathesis (GRIM) (FIG. 1). This reaction proceeds with a moderate degree of regioselectivity leading to a distribution of regiochemical isomers (1) and (1') of 85:15 to 75:25. The GC-MS analysis after the addition of Ni(dppp)Cl$_2$ indicated that only isomer (1) is incorporated into the polymer, while isomer (1') was not consumed.

The first step in the mechanism is the reaction of 2 equiv of 2-bromo-5-chloromagnesium-3-alkylthiophene monomer (1) with Ni(dppp)Cl$_2$ generating a bis-organonickel compound, which undergoes reductive elimination resulting in the formation of an associated pair of the 5,5'-dibromobithienyl (tail-to-tail coupling) and Ni(0). It is proposed that the associated pair is formed as a result of the coordination of 1,3-bis(diphenylphosphino)propane nickel(0) to the thiophene ring in $\eta^2$ or $\eta^4$ bonded fashion. Similar type of Ni(0)-$\eta^2$ arene complexes were previously reported.[33-35] The dimer undergoes fast oxidative addition to the nickel(0) center generating a new organonickel compound. Growth of the polymer chain occurs by insertion of one monomer at a time, where the Ni(dppp) moiety is incorporated into polymer chain as an end group (compound 2 in FIG. 1). According to the proposed mechanism only one structural defect (one tail-to-tail coupling) per polymer chain is generated during the proposed catalytic cycle.

WORKING EXAMPLE 1

First, a kinetic study of the Grignard metathesis method for the synthesis of regioregular poly(3-hexylthiophene) is described. The experimental results can be used to demonstrate the "living" nature of this polymerization.

In the case of Grignard metathesis method, poly(3-alkylthiophenes) with relatively high molecular weight were formed almost immediately. This observation was in contradiction with the generally accepted step growth polymerization mechanism proposed for nickel-catalyzed cross-coupling polymerization, where one would expect the fast disappearance of the monomer and increase of the molecular weight toward the end the reaction.

Influence of Ni(dppp)Cl$_2$ Concentration

Figure 2:
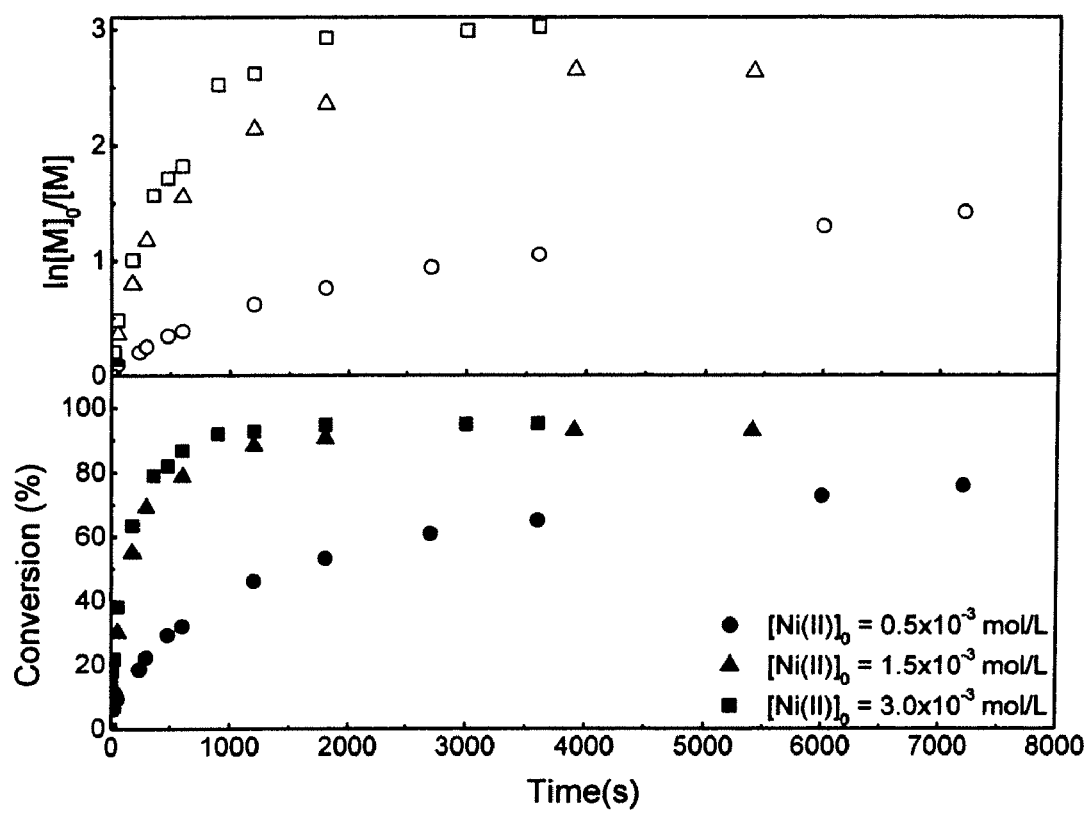
FIG. 2. Conversion (filled symbols) and logarithm of monomer concentration (open symbols) vs. time plots for 2-bromo-5-chloromagnesium-3-hexylthiophene polymerization at variable Ni(dppp)Cl$_2$ concentrations; $[M]_0$=0.07 mol/L; 23-25° C.

Several experiments were performed at various Ni(dppp)Cl$_2$ concentrations with a constant monomer (1) concentration. The reaction rates increased with the increase in the Ni(dppp)Cl$_2$ concentration as shown in FIG. 2. The linearity of the semilogarithmic kinetic plots was observed only up to ~40% conversion. The non-linearity in the semilogarithmic kinetic plots would indicate the presence of termination reactions, which could be due to the aggregation of polymer chains.[36] If the reaction medium becomes heterogeneous due to the formation of polymer aggregates the active centers are not accessible for further insertion of the monomer. Due to the non-linearity of the semilogarithmic kinetic plots, the system can be regarded as a non-optimized "living" or "quasi-living" polymerization. Further optimization in the reaction conditions can provide a better "living" GRIM polymerization.

Figure 3:
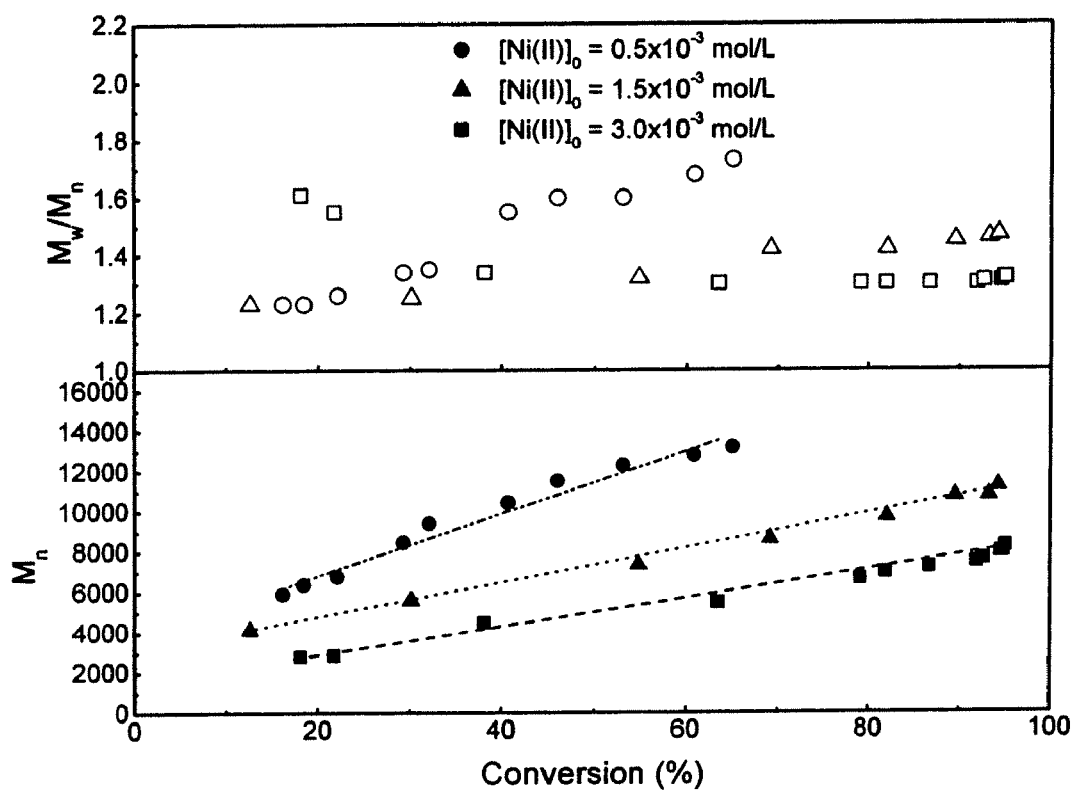
FIG. 3. Dependence of molecular weights and polydispersities on conversion for 2-bromo-5-chloromagnesium-3-hexylthiophene polymerization at variable Ni(dppp)Cl$_2$ concentrations; $[M]_0$=0.07 mol/L; 23-25° C.
Figure 4:
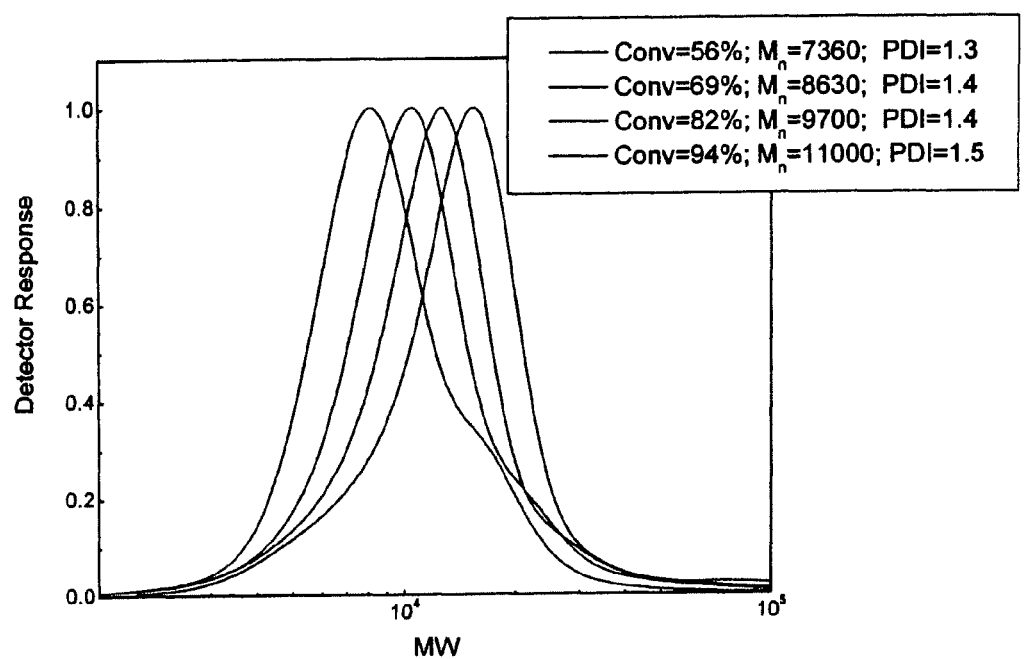
FIG. 4. GPC traces for 2-bromo-5-chloromagnesium-3-hexylthiophene polymerization $[Ni(II)]_0$=1.5×10$^{-3}$ mol/L; $[M]_0$=0.07 mol/L; 23-25° C.

Molecular weight vs conversion plot (FIG. 3) and the GPC traces (FIG. 4) show the increase of molecular weight with conversion, which supports a quasi-"living" chain growth mechanism for nickel-initiated cross-coupling polymerization. The molecular weight of the polymers is a function of the molar ratio of monomer (1) to Ni(dppp)Cl$_2$ initiator (FIG. 3). Furthermore the number average molecular weight of the polymers can be predicted by the formula:

$$DP_n = \frac{\Delta[M]_t}{[Ni(dppp)Cl_2]_0}$$

Accordingly to the proposed mechanism Ni(dppp)Cl$_2$ acts as an initiator rather than a catalyst, and Ni(dppp) moiety is incorporated in polymer as an end group (polymer 2, FIG. 1).

Poly(3-hexylthiophenes) with relatively narrow polydispersities (PDI<1.5) were obtained for the experiments performed at high concentrations of Ni(dppp)Cl$_2$ (FIG. 3).

Influence of Monomer Concentration

Figure 5:
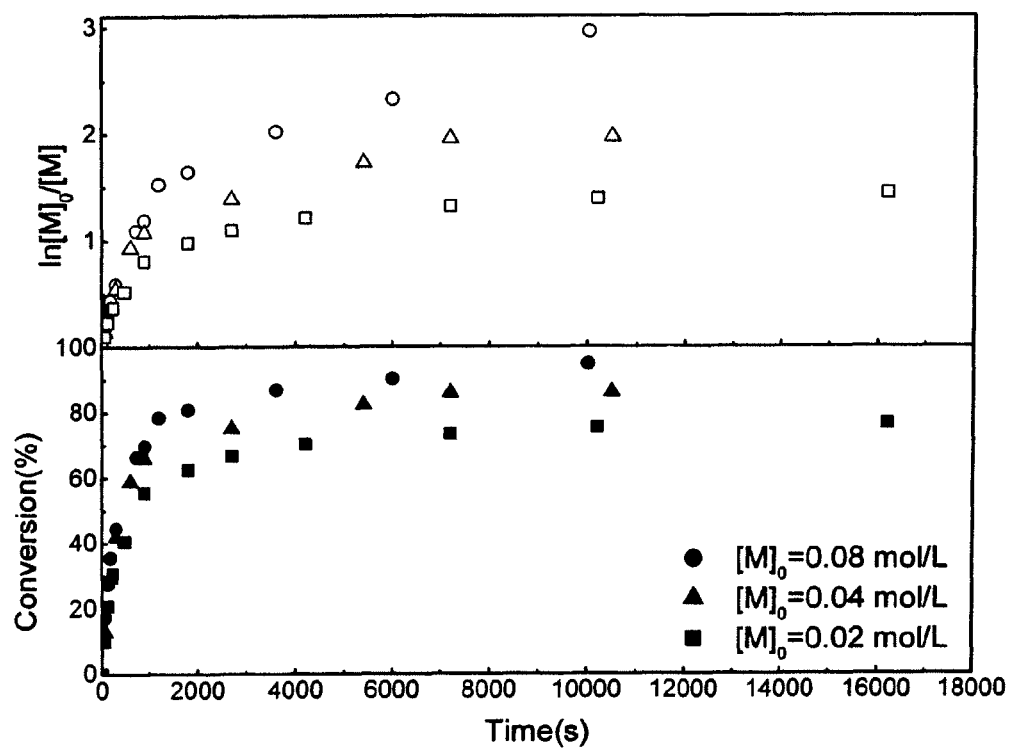
FIG. 5. Conversion (filled symbols) and logarithm of monomer concentration (open symbols) vs. time plots for GRIM polymerization at different 2-bromo-5-chloromagnesium-3-hexylthiophene concentrations; $[Ni(II)]_0$=1.5×10$^{-3}$ mol/L; 0-2° C.

To complement the previous experiments, another series of experiments were conducted at a constant Ni(dppp)Cl$_2$ concentration, while varying the 2-bromo-5-chloromagnesium-3-hexylthiophene (monomer) concentration. The polymerizations were conducted at low temperatures (0-2° C.) to slow the rate of reaction and conserve the linearity of the semilogarithmic kinetic plots. The later allowed for a more accurate determination of the initial polymerization rate. The reaction rates increased with the increase in the monomer concentration as shown in FIG. 5.

Figure 6:
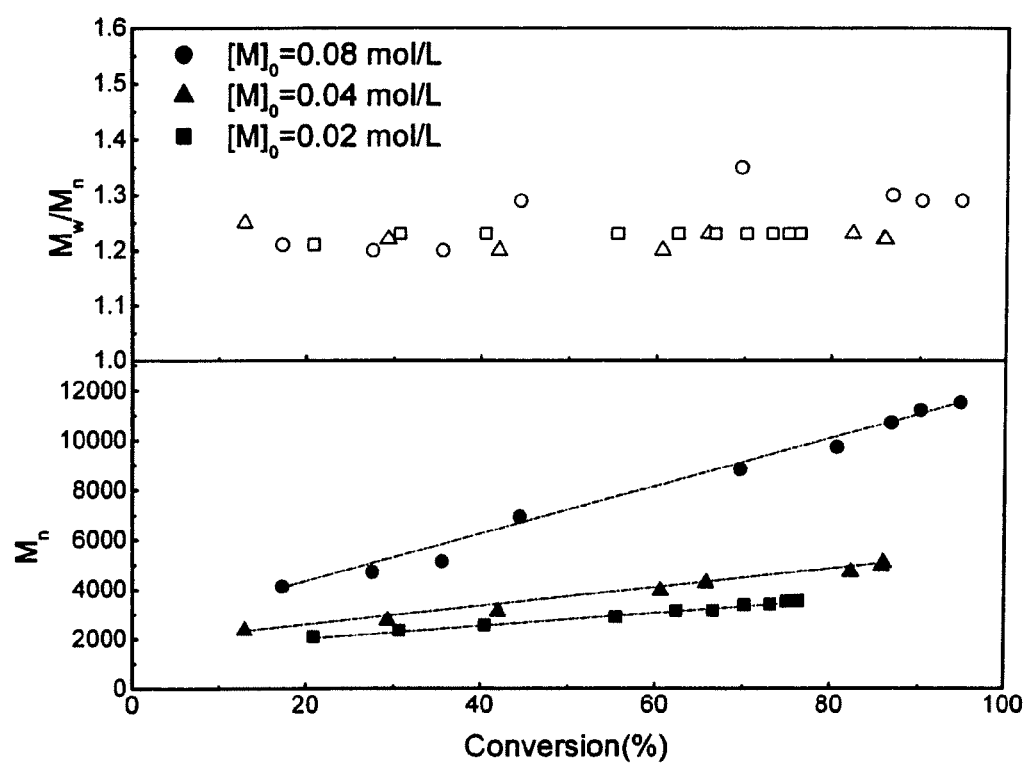
FIG. 6. Dependence of molecular weights and polydispersities on conversion for GRIM polymerization at different 2-bromo-5-chloromagnesium-3-hexylthiophene concentrations; $[Ni(II)]_0$=1.5×10$^{-3}$ mol/L; 0-2° C.

Molecular weight vs conversion plot (FIG. 6) also shows the increase of molecular weight with conversion and poly(3-hexylthiophene) with relatively narrow polydispersities (PDI<1.5) were synthesized.

Figure 7:
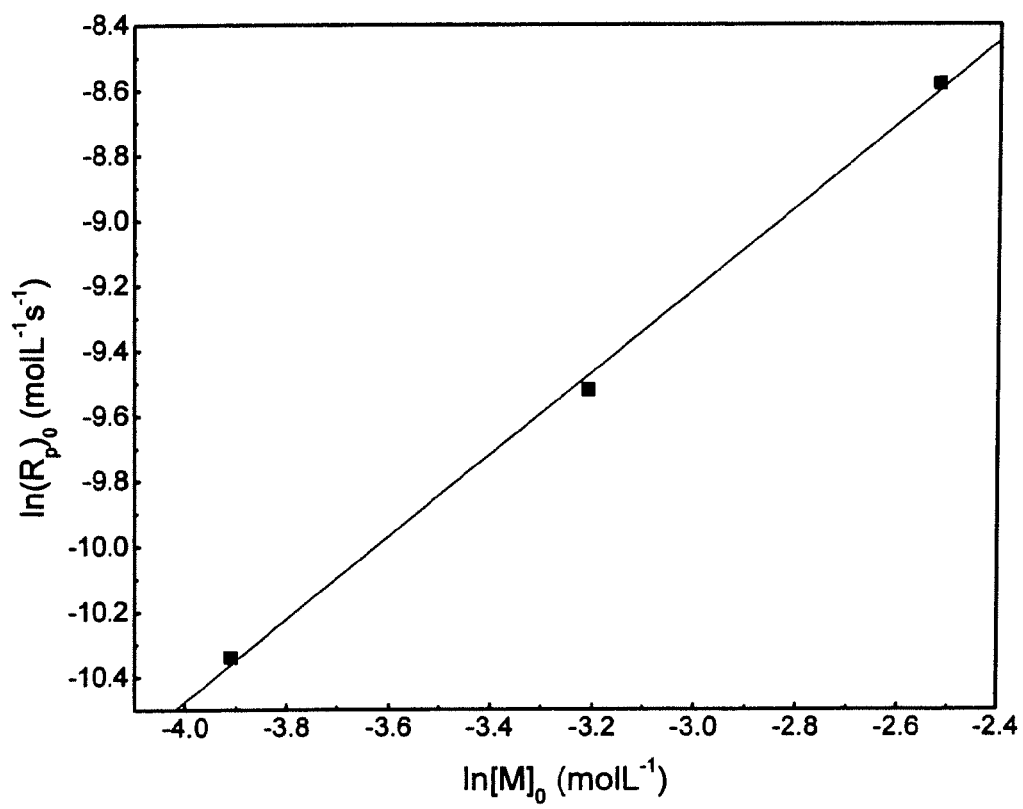
FIG. 7. Plot of the logarithm of the initial rate of polymerization vs. logarithm of monomer concentration; $[Ni(II)]_0$=1.5×10$^{-3}$ mol/L; 0-2° C.

A value of ~1 for the reaction order with respect to the monomer was obtained from the slope of the plot of the logarithm of the initial rate of polymerization vs. the logarithm of the monomer concentration (FIG. 7).

End Group Analysis of Regioregular poly(3-hexylthiophene)

Grignard metathesis method for the synthesis of regioregular poly(3-alkylthiophenes) results in the formation of regioregular polymers (~98% head-to-tail couplings). Quenching of nickel terminated poly(3-alkylthiophene) (polymer 2, FIG. 1) with water/HCl mixture results in the formation of H/Br terminated polymer.

Figure 8:
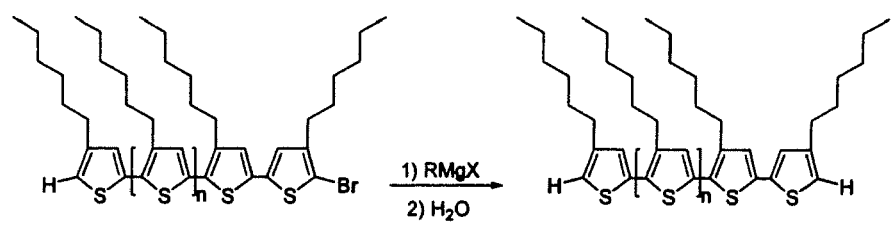
FIG. 8. Magnesium halogen exchange of H/Br terminated regioregular poly(3-hexylthiophene).
Figure 9:
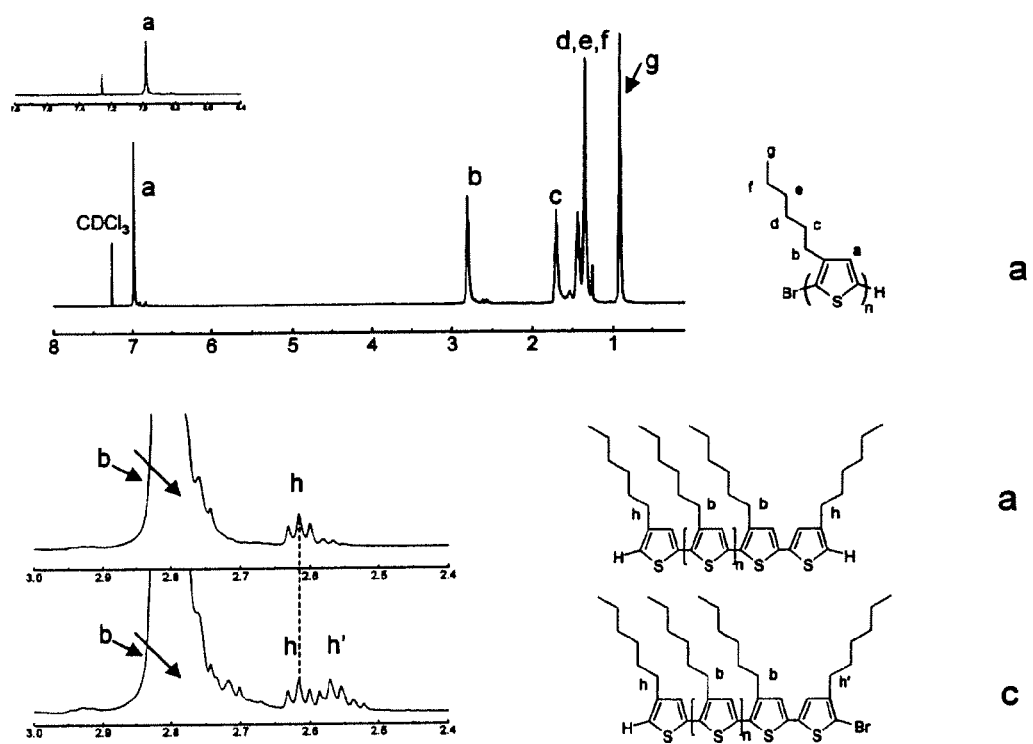
FIG. 9. $^1$H NMR (500 MHz) spectra of (a) rr-poly(3-hexylthiophene) H/Br terminated; (b) expansion of rr-poly(3-hexylthiophene) H/H terminated; and (c) expansion of rr-poly(3-hexylthiophene) H/Br terminated.

As an example, the full 500 MHz $^1$H NMR spectrum of a moderate molecular weight regioregular poly(3-hexylthiophene) (rr-PHT) is presented in FIG. 9. The main absorption signals of rr-PHT are assigned as shown. Two small triplets at δ~2.6 ppm of the same intensity for H/Br terminated rr-PHT can be assigned to the methylene protons on the first carbon substituent (h and h') on the end units. Furthermore, the appearance of the two separate triplet signals at different resonance frequencies is due to different chemical environment around h and h' (FIG. 9(c)). When the H/Br terminated polymer is subjected to a magnesium halogen exchange reaction (FIG. 8) and quenched with an acidic methanol/water mixture, a pristine H/H terminated rr-PHT is formed. Consequently, the signal generated by the methylene protons h' is shifted down field with the two groups (h and h') resonating at the same frequency (FIG. 9(b)). The integration values from $^1$H NMR (500 MHz) spectrum of rr-PHT-H/Br and rr-PHT-H/H terminated polymers are presented in Table 1. The intensity of the h peak is doubled in the absence of the bromine atom relative to the main peak (b) of first β-substituent methylene protons. These observations indicate that NMR analysis cannot distinguish between the two different types of coupling (e.g., head-to-tail (HT) and tail-to-tail (TT)), when rr-PHT H/H terminated contains only one structural defect per polymer chain. However, it allows a relatively accurate determination of molecular weight from the integration of end-group resonances relative to the bulk polymer. For instance, $DP_n$ for the aforementioned polymer equals to the ratio of b to h and results in 50 monomer units corresponding to $M_n$=8,300.

TABLE 1

The integration values from $^1$H NMR (500 MHz) spectrum of rr-poly(3-hexylthiophene) (PHT) H/Br and H/H terminated

| Peak | PHT-H/Br | PHT-H/H |
|------|----------|---------|
| b    | 1        | 1       |
| h    | 0.02     | 0.04    |
| h'   | 0.02     | —       |

Chain Extension by Sequential Monomer Addition

Synthesis of poly(3-hexylthiophene)-b-poly(3-dodecylthiophene)

A previous report showed that the addition of various Grignards reagents to the nickel-terminated poly(3-alkylthiophene) results in the formation of end-functional polymers.[29] The addition of a new portion of 2-bromo-5-chloromagnesium-3-alkylthiophene monomer at the end of the polymerization resulted in the further increase of the molecular weight of the final polymer. Both experiments indicate the "living" nature of the nickel terminated poly(3-alkylthiophene).

The main focus of this section is the chain extension of rr-PATs through sequential addition of a different monomer. An example of chain extension is based on the synthesis of poly(3-hexylthiophene)-b-poly(3-dodecylthiophene) (PHT-b-PDDT) block copolymer and is described herein for the first time.

Figure 10:
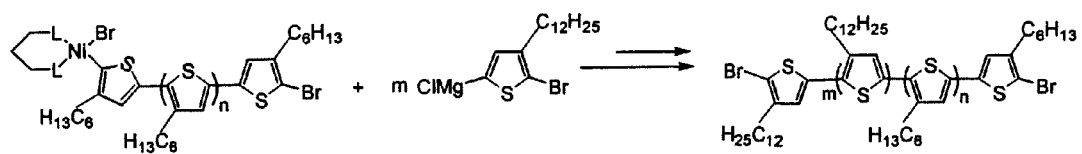
FIG. 10. The synthesis of poly(3-hexylthiophene)-b-poly(3-dodecylthiophene) by chain extension through sequential monomer addition.

The synthetic strategy used for the synthesis of PHT-b-PDDT is outlined in FIG. 10.

The first step involves preparation of rr-PHT with well-defined end group and structural homogeneity. The reaction parameters were chosen with a special consideration with respect to the monomer (2,5-dibromo-3-hexylthiophene) concentration (e.g., $[HT]_0$=0.02 mol/L). Higher dilutions are preferable to insure an easier access to the active centers and to avoid possible precipitation of the resultant polymer. The second step of the reaction is preparation of 2-bromo-5-chloromagnesium-3-dodecylthiophene using Grignard metathesis. This reaction generates a mixture of regiochemical isomers with a typical distribution in the range of 75:25 to 85:15. The 5-bromo-2-chloromagnesium-3-dodecylthiophene does not participate in the catalytic cycle due to the sterically hindered 2-position.

Figure 11:
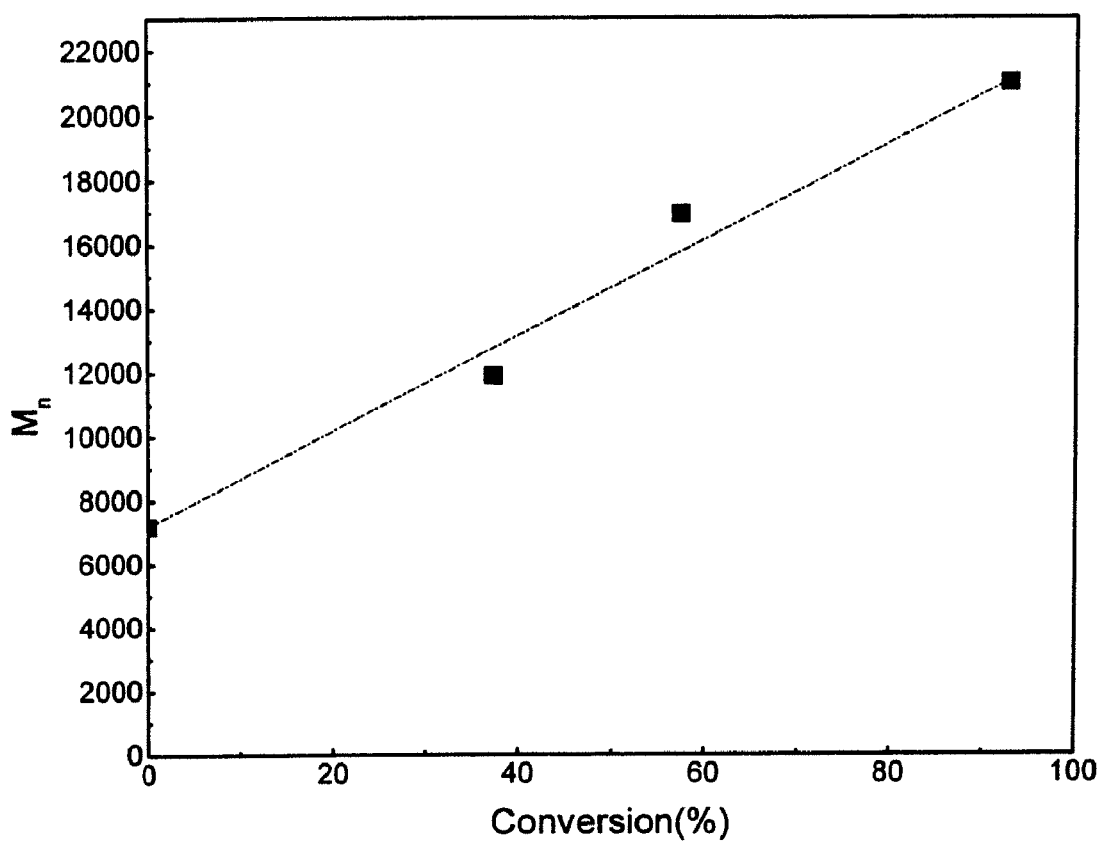
FIG. 11. Molecular weight vs.conversion plot for GRIM 2-bromo-5-chloromagnesium-3-dodecylthiophene initiated by nickel terminated poly(3-hexylthiophene); $[M_{HT}]_0$=0.02 mol/L; $[Ni(II)]_0$=0.6×10$^{-3}$ mol/L; $[M_{DT}]_0$=0.04 mol/L; 18-20° C.
Figure 12:
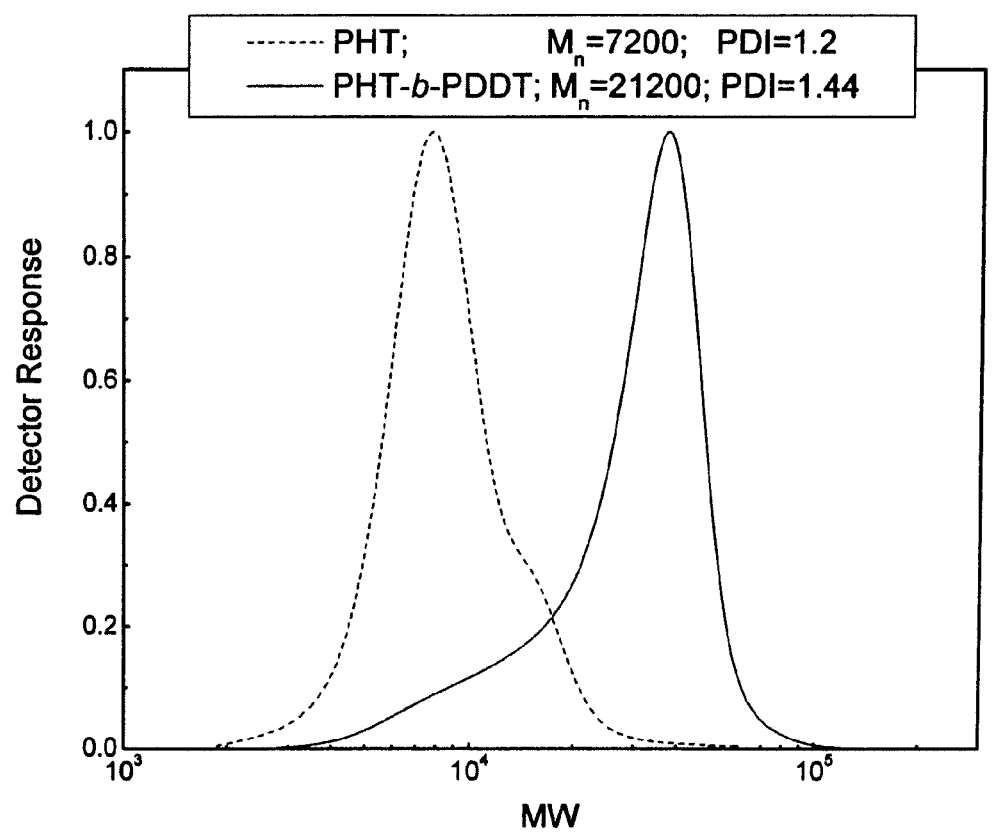
FIG. 12. GPC traces of poly(3-hexylthiophene) and poly(3-hexylthiophene)-b-poly(3-dodecylthiophene) (chain extension) (reaction conditions listed in FIG. 7).
Figure 13:
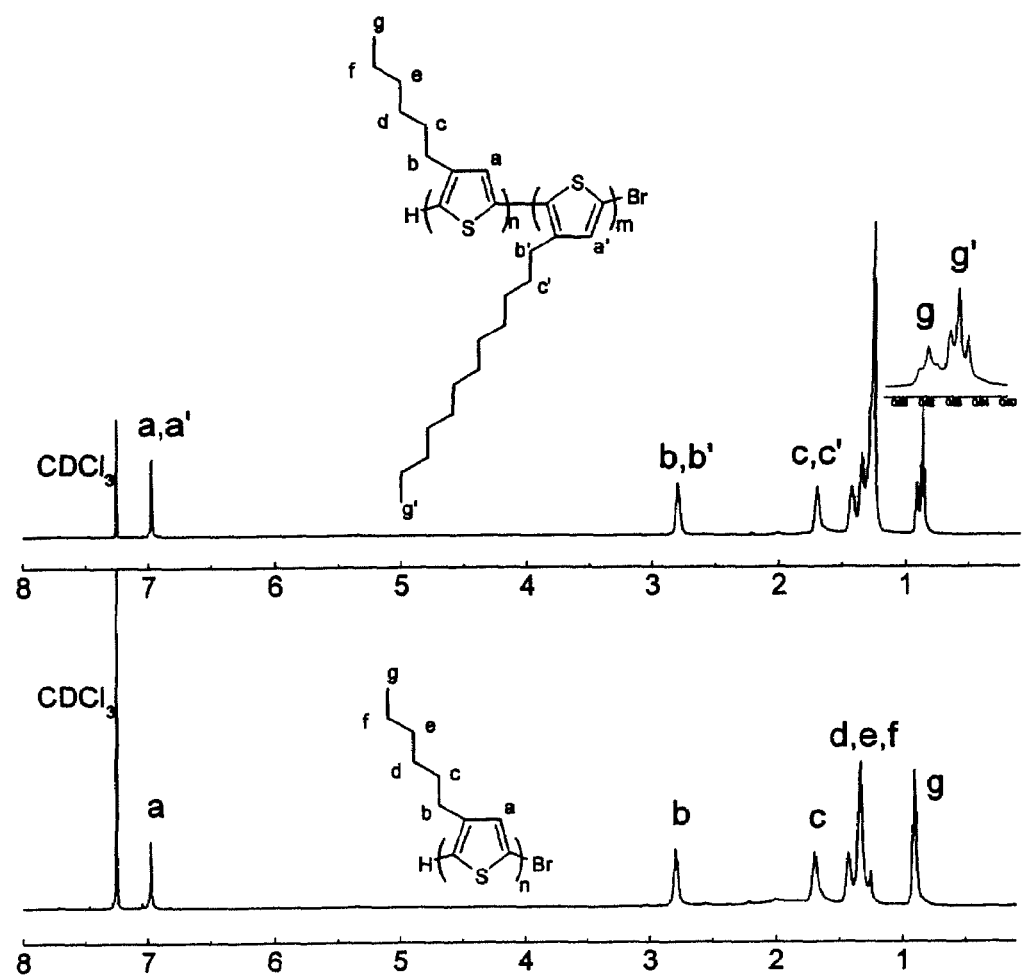
FIG. 13. $^1$H NMR (500 MHz) spectrum of poly(3-hexylthiophene) (bottom) and poly(3-hexylthiophene)-b-poly(3-dodecylthiophene) (top).
Figure 14:
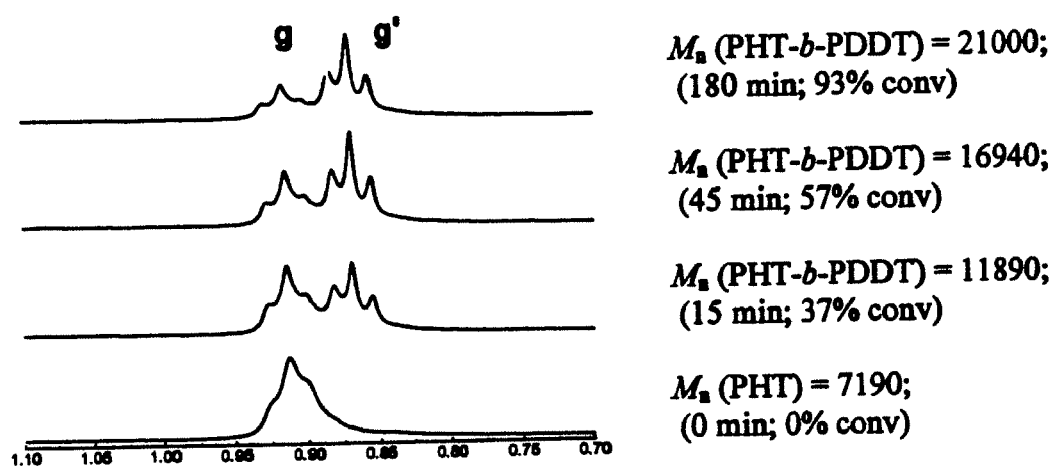
FIG. 14. $^1$H NMR (500 MHz) expansion in the region 0.7-1.1 ppm for starting polymer PHT and for PHT-b-PDDT diblock copolymers at different reaction times.

The reaction was relatively fast and very efficient, reaching 90% conversion in less than 3 hours, at room temperature. The molecular weight versus conversion plot (FIG. 11) and the GPC traces (FIG. 12) showed an increase of molecular weight with conversion, which strongly supported the chain extension through "living" intermediates. The low molecular weight tailing observed in the GPC trace of PHT-b-PDDT indicates the formation of some dead or inactive chains during the chain extension process. The successive monomer insertion into the second block was monitored by $^1$H NMR. The full $^1$H NMR spectra of the initial rr-PHT homopolymer and the resultant di-block copolymer are represented in FIG. 13. The main resonance frequencies were assigned as shown. FIG. 14 illustrates the progressive incorporation of PDDT block into copolymer (the intensity of g' protons increases as the molecular weight of the PDDT block increases). The resultant copolymer was readily soluble in common organic solvents (e.g., chloroform, toluene, 1,2,4-trichlorobenzene, THF) and possessed excellent film-forming abilities.

Figure 15:
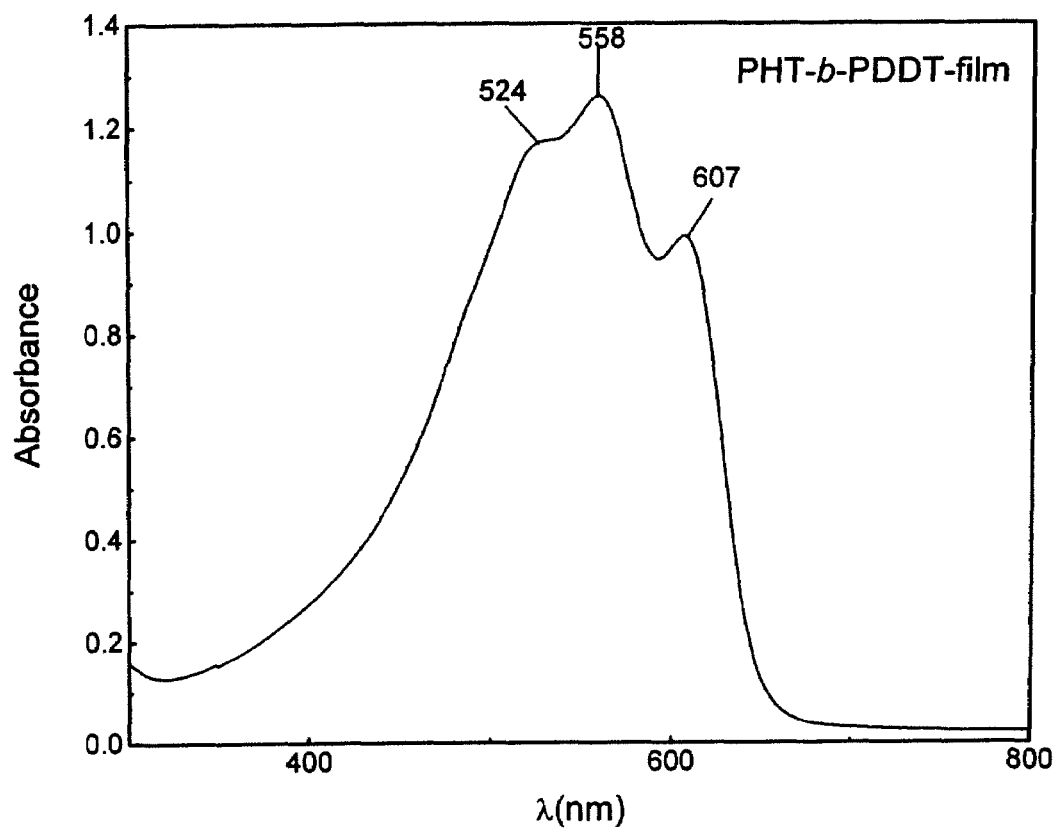
FIG. 15. UV-VIS spectrum of poly(3-hexylthiophene)-b-poly(3-dodecylthiophene) diblock copolymer.

The Uv-Vis spectra of the poly(3-hexylthiophene)-b-poly(3-dodecylthiophene) (FIG. 15) in the solid state indicates the vibrational structure with well-defined peaks (e.g. $\lambda_{max}$=558 nm and the lower intensity peaks at $\lambda$=524 and 607 nm).

Synthesis of poly(3-dodecylthiophene)-b-polythiophene-b-poly(3-dodecylthiophene)

Figure 16:
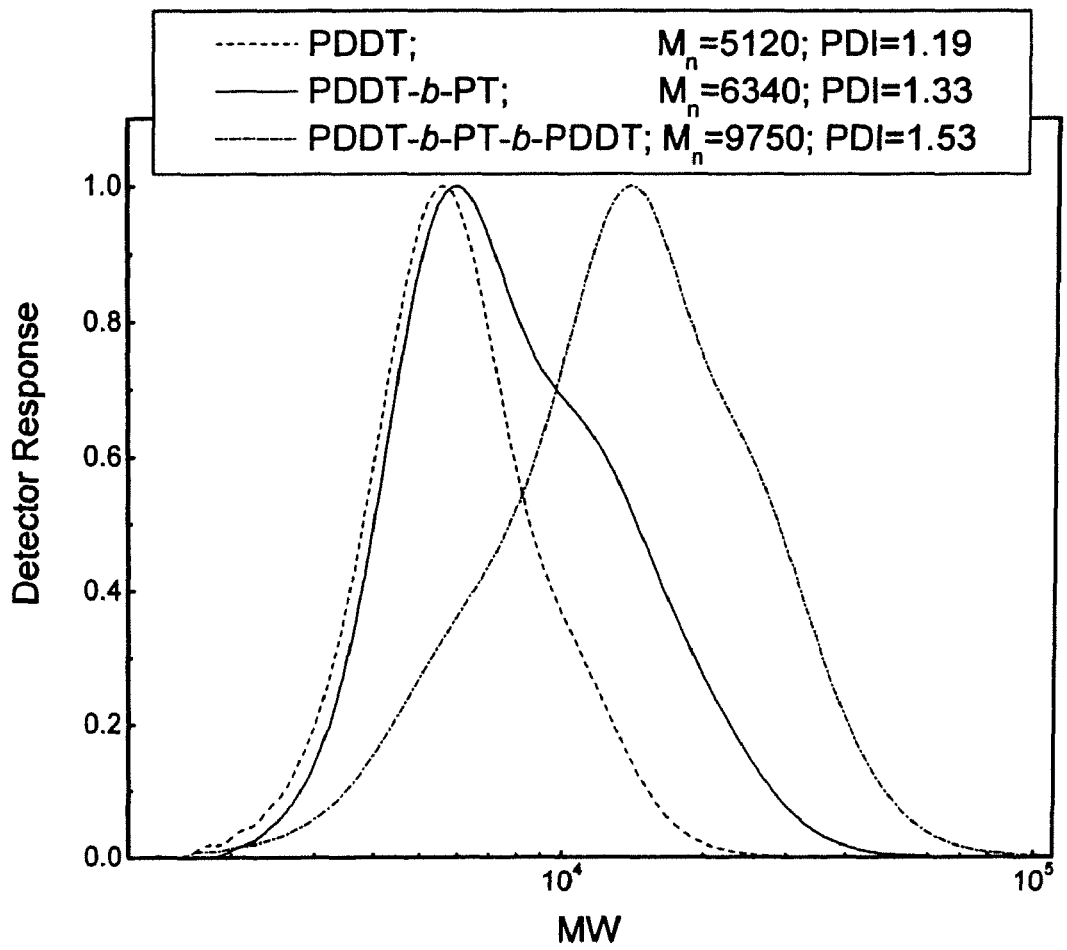
FIG. 16. GPC traces of poly(3-dodecylthiophene), poly(3-dodecylthiophene)-b-polythiophene and poly(3-dodecylthiophene)-b-polythiophene-b-poly(3-dodecylthiophene) (chain extension) Reaction conditions: $[M_{DT}]_0$=0.06 mol/L; $[Ni(II)]_0$=1.8×10$^{-3}$ mol/L; $[M_{TH}]_0$=0.02 mol/L; $[M_{DT}]_1$=0.06 mol/L; 18-20° C.

Synthesis of poly(3-dodecylthiophene)-b-polytiophene-b-poly(3-dodecylthiophene) tri-block copolymer was performed in a similar manner. The length of polythiophene block was carefully chosen due to its very poor solubility. The shift in the GPC traces indicates the formation of the block copolymer (FIG. 16). However the low molecular weight tailing in the GPC traces indicates the presence of some dead or inactive chains during the chain extension process. The low solubility of the poly(3-dodecylthiophene)-b-polythiophene could cause the precipitation of the nickel-terminated polymer resulting in the loss of the activity towards further monomer insertion. This could be prevented by the use of higher dilutions or lowering the polythiophene content.

Figure 17:
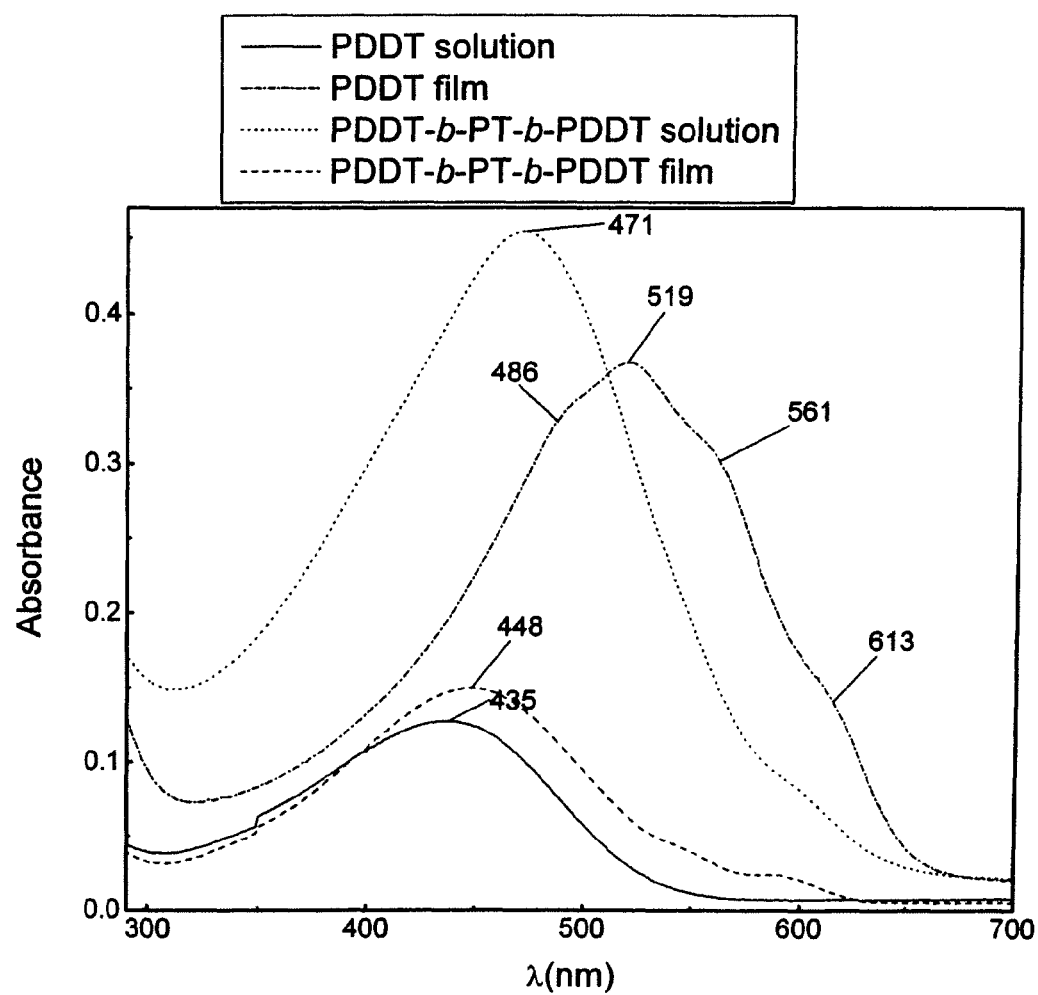
FIG. 17. UV-VIS spectrum of poly(3-dodecylthiophene) (PDDT) precursor and poly(3-dodecylthiophene)-b-polythiophene-b-poly(3-dodecylthiophene) (PDDT-b-PT-b-PDDT) tri-block copolymer.

The UV-Vis spectra of poly(3-dodecylthiophene) precursor and poly(3-dodecylthiophene)-b-polythiophene-b-poly(3-dodecylthiophene) (FIG. 17) films shows a bathochromic shift as compared with the solution.

Conductivities of poly(3-alkylthiophene) Block Copolymers

Figure 18:
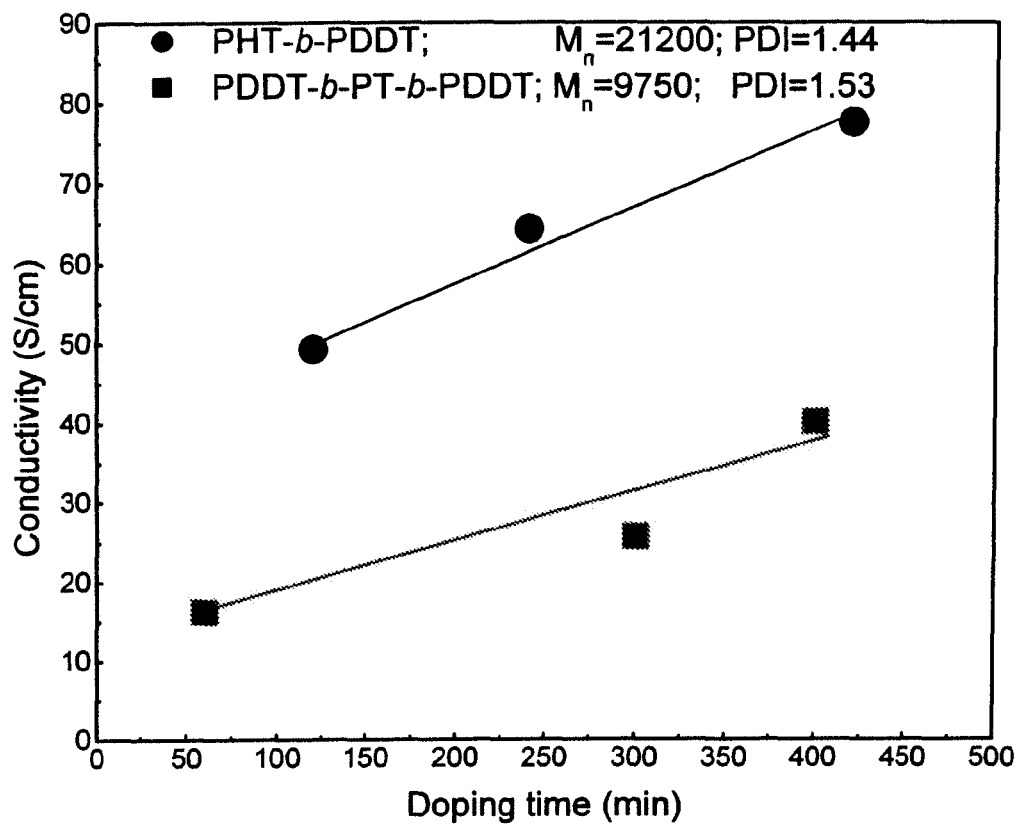
FIG. 18. Conductivity of poly(3-hexylthiophene)-b-poly(3-dodecylthiophene) and poly(3-dodecylthiophene)-b-polythiophene-b-poly(3-dodecylthiophene) copolymers as a function of the doping time.

The films of poly(3-hexylthiophene)-b-poly(3-dodecylthiophene) (PHT-b-PDDT) and poly(3-dodecylthiophene)-b-polythiophene-b-poly(3-dodecylthiophene) (PDDT-b-PT-b-PDDT) exhibited relatively good electrical conductivities. As illustrated in FIG. 18, the conductivity increased proportionally with doping times.

Figure 19:
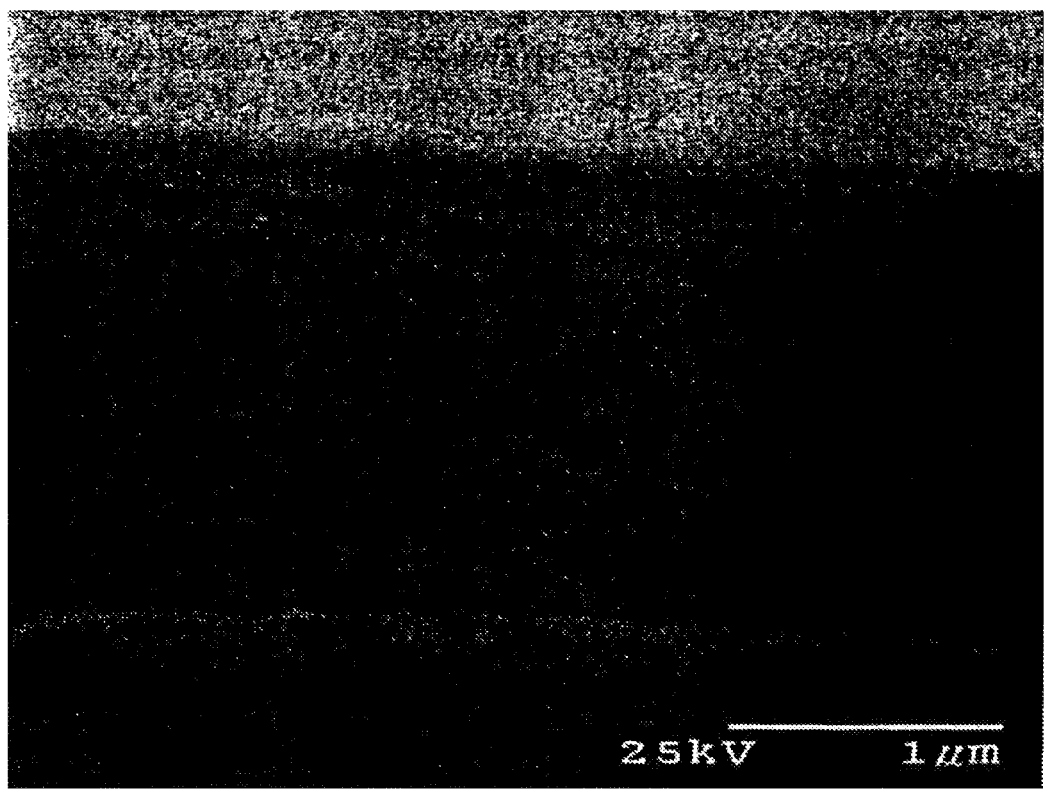
FIG. 19. SEM image of PHT-b-PDDT film.
Figure 20:
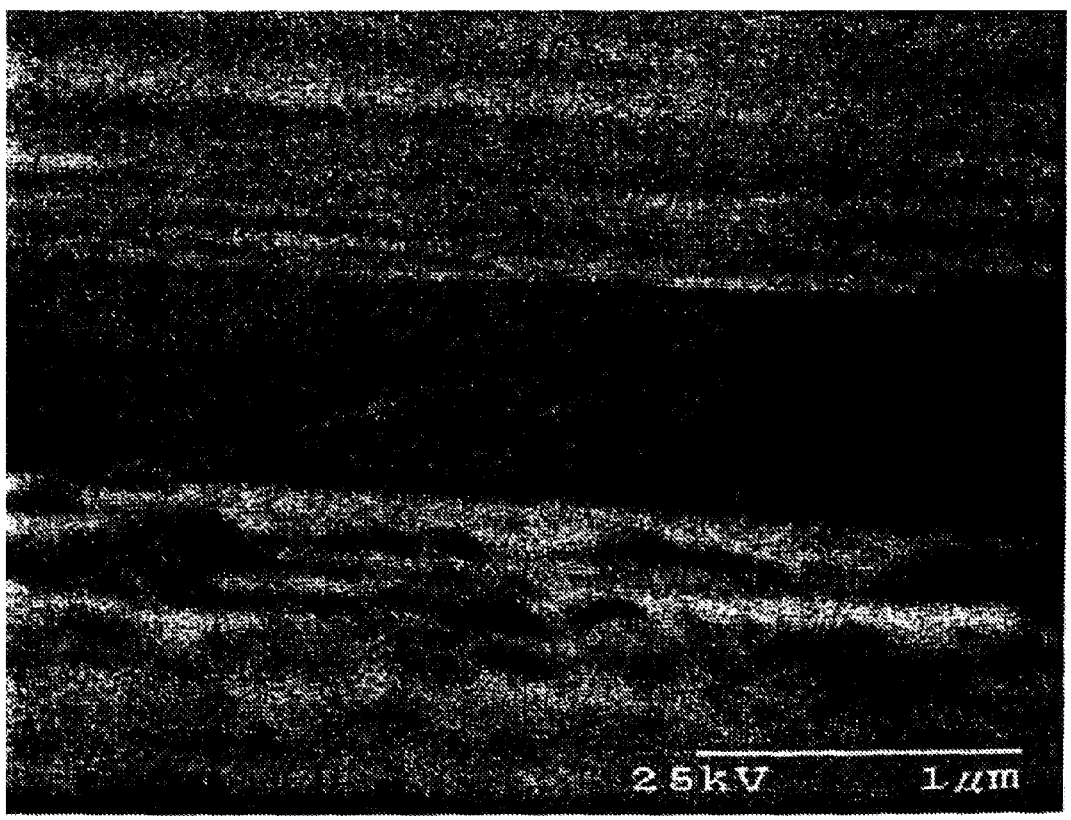
FIG. 20. SEM image of PDDT-b-PT-b-PDDT film.

FIGS. 19 and 20 provide SEM images of the block copolymer thin films. FIG. 19 provides an SEM image of PHT-b-PDDT film (drop cast from toluene solution; conc=5 mg/mL; film thickness=1.67 μm). FIG. 20 provides an SEM image of PDDT-b-PT-b-PDDT film (drop cast from toluene solution; conc=5 mg/mL; film thickness=0.698 μm).

Experimental Part for GRIM Polymerization and Chain Extension Study

Materials

Synthesis of 2,5-dibromo-3-hexylthiophene and 2,5-dibromo-3-dodecylthiophene were performed according to the literature.[13,14] THF was dried over K/benzophenone and freshly distilled prior to use. [1,3-bis(diphenylphosphino) propane]-dichloronickel(II) (Ni(dppp)Cl$_2$), alkyl magnesium chloride (2M in diethyl ether) and p-dimethoxybenzene were purchased from Aldrich Chemical Co., Inc. and used without further purification.

Polymerization Experiment

In a typical experiment, a dry 100 mL three-neck round bottom flask was flashed with $N_2$ and was charged with 2,5-dibromo-3-hexylthiophene (1.6 g, 5 mmol), p-dimethoxybenzene (internal standard) (0.2 g), and anhydrous THF (50 mL). A 2M solution of alkyl magnesium chloride (2.5 mL, 5 mmol) in diethyl ether (Et$_2$O) was added via a deoxygenated syringe, and the reaction mixture was gently refluxed for 2 hrs. At this time an aliquot (0.5 mL) was taken out and quenched with water. The organic phase was extracted in Et$_2$O and subjected to GC-MS analysis to determine the composition of the reaction mixture. The main components of the reaction mixture were 2-bromo-5-chloromagnesium-3-hexylthiophene and 5-bromo-2-chloromagnesium-3-hexylthiophene regioisomers. Usually less than 5% of unreacted 2,5-dibromo-3-hexylthiophene was detected by GC-MS analysis. The concentration of 2-bromo-5-chloromagnesium-3-hexylthiophene isomer was considered as the initial monomer concentration. The oil bath was then removed and the reaction mixture was allowed to cool down to 23-25° C., at which time Ni(dppp)Cl$_2$ (0.04 g, 0.075 mmol) was added as a suspension in 1 mL of anhydrous THF. After addition of Ni(dppp)Cl$_2$, aliquots (1 mL) were taken at different time intervals and each was precipitated in methanol (5 mL). For each aliquot a sample was prepared in Et$_2$O (2 mL) and subjected to GC-MS analysis for the determination of concentration of unreacted monomer. After filtration through PTFE filters (0.45 µm), the molecular weight of the pristine polymer samples was measured by GPC.

Chain Extension Experiment

A dry 250 mL three-neck round bottom flask (A) was charged with 2,5-dibromo-3-hexylthiophene (1.6 g, 5 mmol), p-dimethoxybenzene (internal standard) (0.3 g) and anhydrous THF (165 mL). A 2M solution of alkyl magnesium chloride (2.5 mL, 5 mmol) in diethyl ether (Et$_2$O) was added via a deoxygenated syringe, and the reaction mixture was gently refluxed for 2 hrs. After the consumption of 2,5-dibromo-3-hexylthiophene the reaction mixture was cooled at 20-22° C. The concentration of unreacted 2-bromo-5-chloromagnesium-3-hexylthiophene was determined by GC-MS (more than 90% of monomer was consumed in 2 hrs). Ni(dppp)Cl$_2$ (0.05 g, 0.1 mmol) was added as a suspension in 1 mL of anhydrous THF. The polymerization continued for 3 hrs before addition of 2-bromo-5-chloromagnesium-3-dodecylthiophene (prepared as described below).

A dry 50 mL three-neck round bottom flask (B) flashed with N$_2$ was charged with 2,5-dibromo-3-dodecylthiophene (4.1 g, 10 mmol) and anhydrous THF (10 mL). A 2M solution of alkyl magnesium chloride (5 mL, 10 mmol) in diethyl ether (Et$_2$O) was added via a deoxygenated syringe, and the reaction mixture was gently refluxed for 2 hrs. The concentration of 2-bromo-5-chloromagnesium-3-dodecylthiophene was determined by GC-MS.

Analyses

GC-MS analysis was performed on a Hewlett-Packard Agilent 6890-5973 GC-MS workstation. The GC column was a Hewlett-Packard fused silica capillary column cross-linked with 5% phenylmethyl siloxane. Helium was the carrier gas (1 mL/min). The following conditions were used for all GC-MS analyses: Injector temperature, 250° C.; initial temperature, 70° C.; temperature ramp, 10° C./min; final temperature, 300° C. GPC measurements were performed on a Waters 2690 separations module apparatus and a Waters 2487 dual λ absorbance detector with chloroform as the eluent (flow rate 1 mL/min, 35° C., λ=254 nm) and a series of three Styragel columns (10$^4$, 500, 100 Å; Polymer Standard Services). Toluene was used as an internal standard and calibration based on polystyrene standards was applied for determination of molecular weights. $^1$H NMR spectra of the polymer solutions in CDCl$_3$ were recorded on a Bruker Avance 500 MHz spectrometer. UV-Vis-NIR spectra were measured on polymer solutions in anhydrous chloroform or polymer thin films cast onto 22 mm square cover glass using a UV-Vis-NIR Spectrophotometer Varian Cary 5000. Electrical conductivity measurements were performed by a standard spring-loaded pressure contact Signatone S-301-4 four point probe, which was connected to a Hewlett-Packard 6632A System DC Power Supply, a Hewlett Packard 3457 A multimeter (for voltage measurements), and a Keithley Model 196 System DMM (for current measurements). Thin polymer films cast onto glass were chemically oxidized by exposure to iodine vapors for various periods of time. The films were obtained from drop cast solutions of the polymer in dry toluene (5 mg mL$^{-1}$). The film thickness (cross-section) was measured by Scanning Electron Microscopy (SEM) using a Hitachi S-2460N electron microscope.

WORKING EXAMPLE 2

Figure 21:
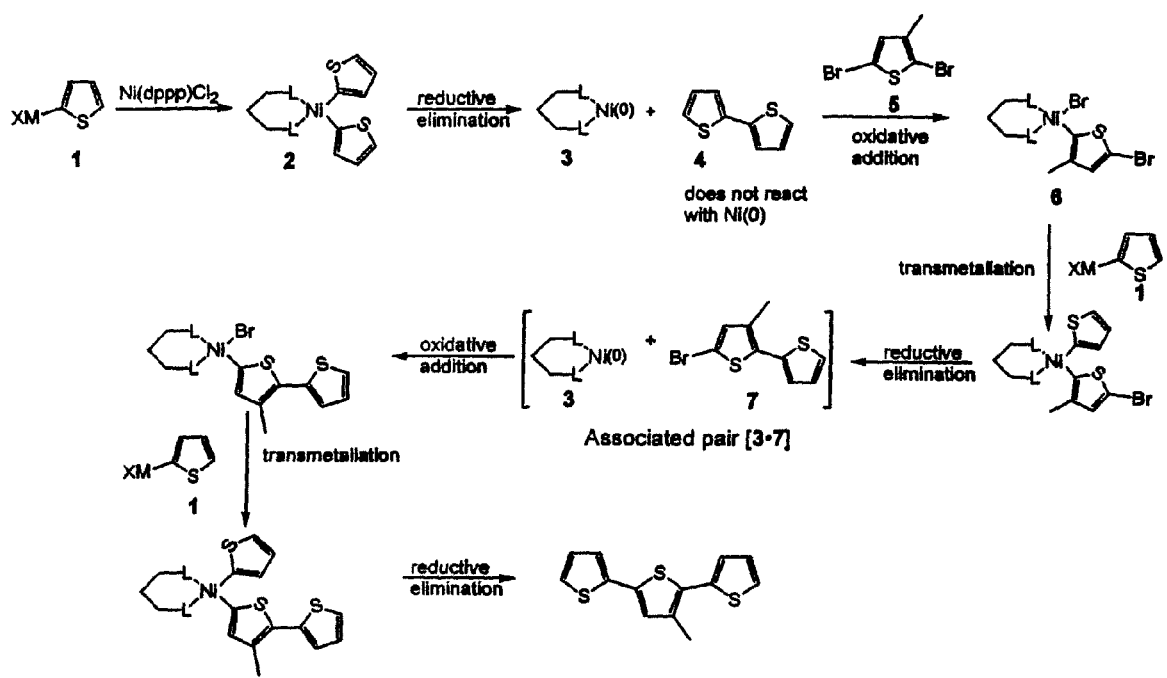
FIG. 21. Mechanism for the nickel initiated cross-coupling trimer formation.

A model experiment was first carried out. In a cross-coupling step polymerization catalyzed by Ni(dppp)Cl2, one would expect a fast disappearance of the monomer and increase of the polymer molecular weight toward the end of the polymerization. On the basis of experimental results, it was observed that relatively high molecular weight polymer forms almost immediately. As a model reaction, it was also found that 2 equiv of a variety of aryl dibromides and 1 equiv of an aryl organometallic (either magnesium or zinc) gives a near quantitative yield of the trimeric aryl and minor amounts (<1%), if any, of the dimer. These results indicate the very strong preference of the Ni(0) (See FIG. 21, intermediate 3) to form a nondiffusive associated pair, resulting in near 100% formation of the trimer. The results indicate that the polymerization proceeds with selective oxidation addition to the growing 2-bromopolythiophene and that these regioregular polymerizations progress by a chain growth mechanism rather than a step growth.

Figure 22:
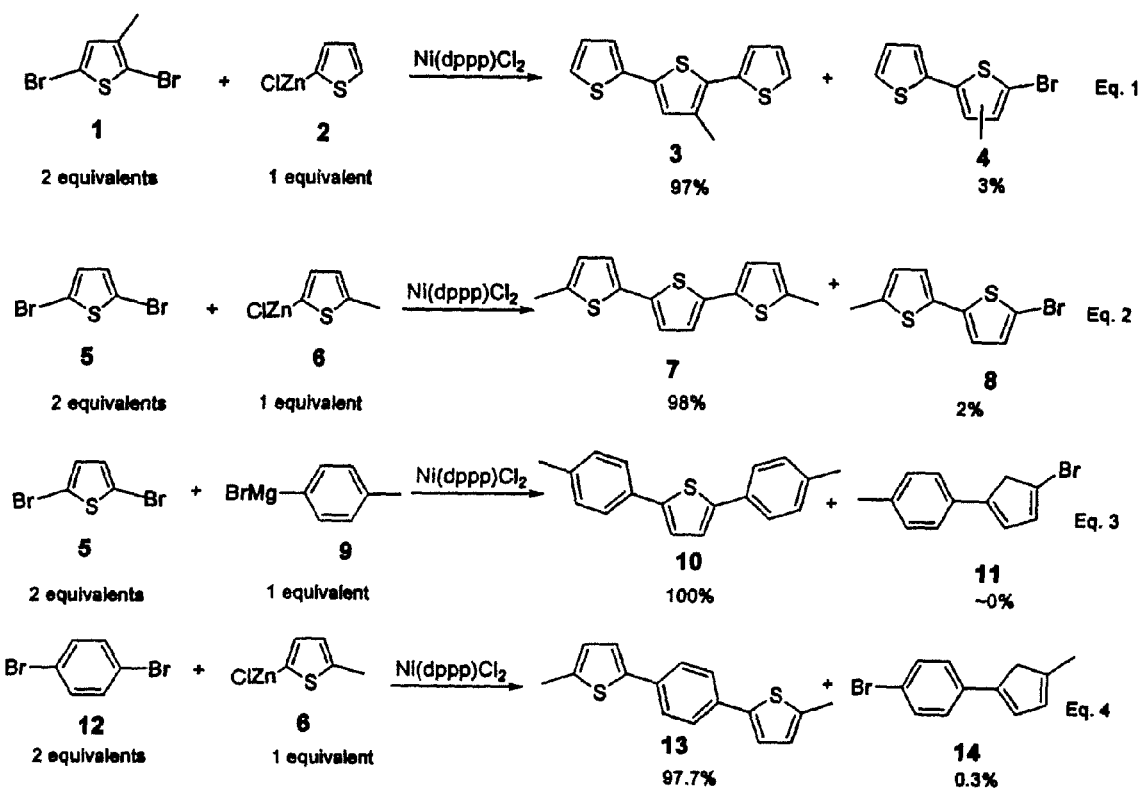
FIG. 22. Model reactions showing that Ni(0) reacts preferably with the newly formed brominated aryl dimer, resulting in nearly 100% formation of the trimer.

A typical example is when a 0.1 M solution of thiophene (0.42 g, 5 mmol) or 2-methylthiophene (0.49 g, 5 mmol) in anhydrous THF (50 mL) cooled to −40° C. (acetonitrile/dry ice bath) was charged with a dropwise addition of n-butyl-lithium (2 mL, 5 mmol) via a syringe. After stirring the reaction mixture for 40 min at −40° C., anhydrous ZnCl$_2$ (0.7 g, 5 mmol) was added in one portion, and the stirring continued for another 15 min. The cooling bath was removed, and the reaction mixture was allowed to warm to RT, at which point the reaction mixture was transferred to a different reaction flask charged with 10 mmol an appropriate dibromoaryl compound (e.g., 2,5-dibromo-3-methylthiophene, 2,5-dibromothiophene, or 1,4-dibromo-benzene) and 0.05 mmol of [1,3-bis(diphenylphosphino)-propane]dichloronickel (II) (Ni(dppp)Cl$_2$) via cannula. The reaction was allowed to proceed for 12 h followed by quenching in water. The organic layer was extracted with diethyl ether (Et$_2$0) and subjected to GC-MS analysis to determine product composition and distribution. The reaction schemes and obtained results are provided in FIGS. 21 and 22.

WORKING EXAMPLE 3

Poly(3-hexylthiophene) (HT-PHT) was prepared by the original method that provides a high specificity of H-T configuration of the repeating units (>98%) H-T coupling).

Figure 23:
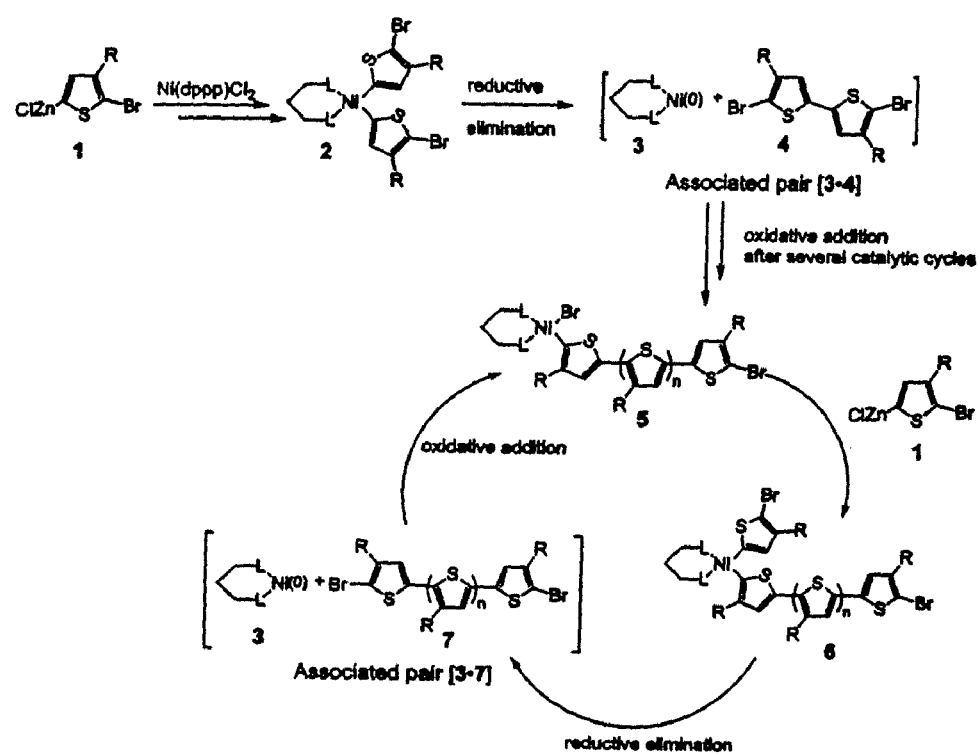
FIG. 23. Mechanism for Nickel-Initiated Cross-Coupling Polymerization

The mechanism of the cross-coupling chain growth polymerization is outlined in FIG. 23. The first step in the mechanism, where the 2-bromo-5-chlorozinc 3-hexylthiophene monomer (1) generated in situ from 2-bromo-3-hexylthiophene reacts with Ni(dppp)Cl2 yielding the organonickel compound (2), is as it has been described by others. Here, the difference in the mechanism in that reductive elimination of 2 immediately forms an associated pair (3-4) of the tail-to-tail aryl halide dimer (4) and nickel (0) (3). The dimer 4 undergoes fast oxidative addition to the nickel center generating 5 in view of the fact that the formation of the complex 3-4 eliminates potential separation of 4 from 3. Subsequently, growth of the polymer chain occurs by insertion of one monomer at a time as shown in the reaction cycle (5-→6-→[3-7]-→5) where the Ni(dppp) moiety is incorporated into polymer chain as end group. Addition of various Grignard reagents (RMgX) at the end of polymerization results in end-capping of HT-PATs with R' end group, which supports the fact that Ni(dppp)Cl2 acts as an initiator rather than a catalyst. Furthermore, adding organometallic (e.g., magnesium or zinc)

thiophene bromides to species 5 results in the formation of block copolymers, providing a strong evidence for the living nature of this polymerization.

In a typical polymerization experiment, a dry 100 mL three-neck flask was flashed with dinitrogen ($N_2$) and was charged with diisopropylamine (0.50 mL, 3.5 mmol) and THF (30 mL); both were added via a syringe. The reaction flask was cooled to 0° C., and n-butyllithium (2.0 mL, 3 mmol) was added dropwise via syringe. After 20 min of stirring at 0° C., the solution was chilled to –76° C. (acetone/dry ice bath), and stirring continued for 5 min. To this reaction mixture a previously chilled to –76° C. 0.3 M solution of 2-bromo-3-hexylthiophene (0.73 g, 3 mmol) in anhydrous THF (10 mL) was added via cannula. The reaction mixture was stirred for 1 h at –76° C., at which time anhydrous $ZnCl_2$ (0.50 g, 3.6 mmol) was added in one portion and completely dissolved after 30 min of stirring. The cooling bath was removed, and the reaction mixture was allowed to warm to RT, at which time 2,2'-bithiophene (0.16 g, 1 mmol) was added in one portion and used as an internal standard. To this mixture Ni(dppp)$Cl_2$ (29 mg, 0.053 mmol) was added in one portion, and the reaction mixture was stirred at RT. Aliquots (1 mL) were taken at different time intervals (e.g., 1, 3, 5, 8 min etc., and the final aliquot was taken at 12 h), and each was precipitated in methanol (5 mL). For each aliquot a GC sample was prepared in $Et_2O$ (2 mL) and was subjected to analytical GC and subjected to GC-MS analysis. After filtration, the molecular weight of the pristine polymer samples was measured by gel permeation chromatography (GPC) on a Waters 2690 separations module apparatus and a Waters 2487 dual λ absorbance detector with chloroform as the eluent (flow rate 1.0 mL/min, 35° C., λ=254 nm) with a series of three Styragel columns ($10^4$, 500, 100 Å; Polymer Standard Services). Toluene was used as an internal standard, and calibration based on polystyrene standards was applied for determination of molecular weights. GC-MS was performed on an Agilent 6890-5973 GC-MS workstation. The GC column was a Hewlett-Packard fused silica capillary column cross-linked with 5% phenylmethyl siloxane. Helium was the carrier gas (1 mL/min). Unless otherwise noted, the following conditions were used for all GC/MS analyses: injector temperature, 250° C.; initial temperature, 70° C.; temperature ramp, 10° C./min; final temperature, 300° C.

Figure 24:
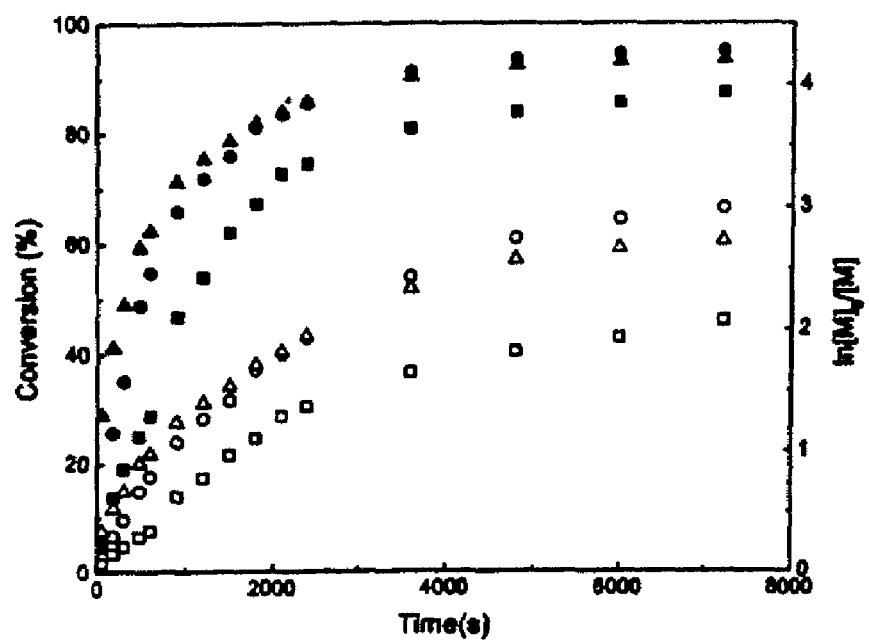
FIG. 24. Conversion (filled symbols) and logarithm of monomer and concentration (open symbols) vs time plots for 2-bromo-3-hexylthiophene polymerization at different concentration of Ni(dppp)Cl$_2$ initiator (23-25° C.); $[M]_0$=0.075 mol/L: (■,□) $[M]_0$:[Ni(dppp)Cl$_2$]=136:1; (●,○) $[M]_0$:[Ni(dppp)Cl$_2$]=57:1; (▲,Δ) $[M]_0$:[Ni(dppp)Cl$_2$]=49:1.

To support the proposed chain growth mechanism, several experiments were performed at constant monomer concentration and variable Ni(dppp)$Cl_2$ concentration. All the reactions were very fast, reaching almost 90% conversion in less than 2 h at room temperature. The reaction rates increased with the increase in Ni(dppp)$Cl_2$ concentration (FIG. 24). Linear semilogarithmic kinetic plots were obtained up to 50% conversion (e.g., [M]$_0$:[Ni(dppp)$Cl_2$]=49:1). The nonlinearity of semilogarithmic kinetic plots would, however, indicate the presence of termination reactions, which could be due to the formation of large supramolecular aggregates of polymer species mixed with unassociated or very weakly associated polythiophene chains. A reaction order of about 1 with respect to Ni(dppp)$Cl_2$ concentration was obtained from the slope of the plot of the logarithm of the initial rate of polymerization vs the logarithm of the Ni(dppp)$Cl_2$ concentration.

Figure 25:
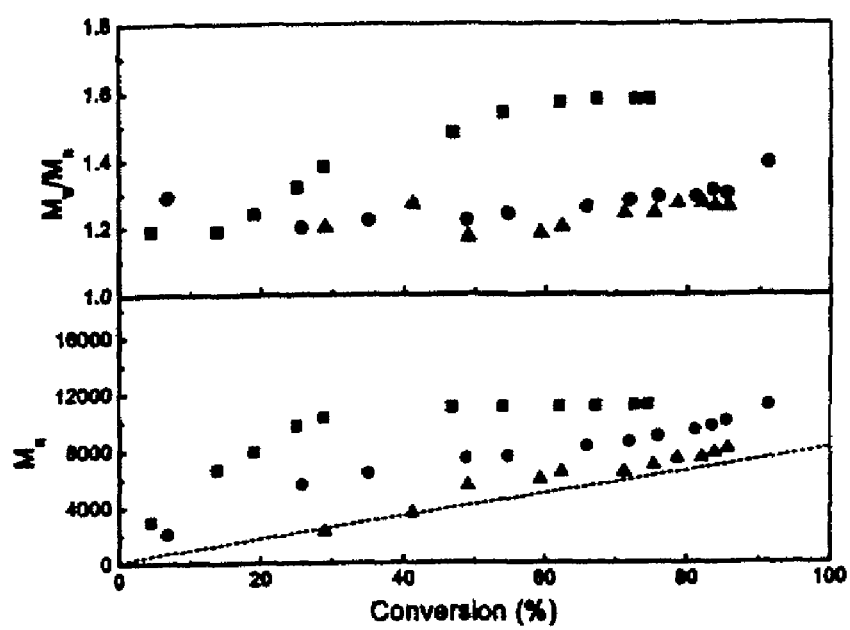
FIG. 25. Dependence of molecular weights and polydispersities on conversion for 2-bromo-3-hexylthiophene polymerization at different concentration of Ni(dppp)Cl$_2$ initiator (23-25° C.); $[M]_0$=0.075 mol/L: (■) $[M]_0$:[Ni(dppp)Cl$_2$]=136:1; (●) $[M]_0$:[Ni(dppp)Cl$_2$]=57:1; (▲) $[M]_0$:[Ni(dppp)Cl$_2$]=49:1 (the dashed line shows the theoretical molecular weight).
Figure 26:
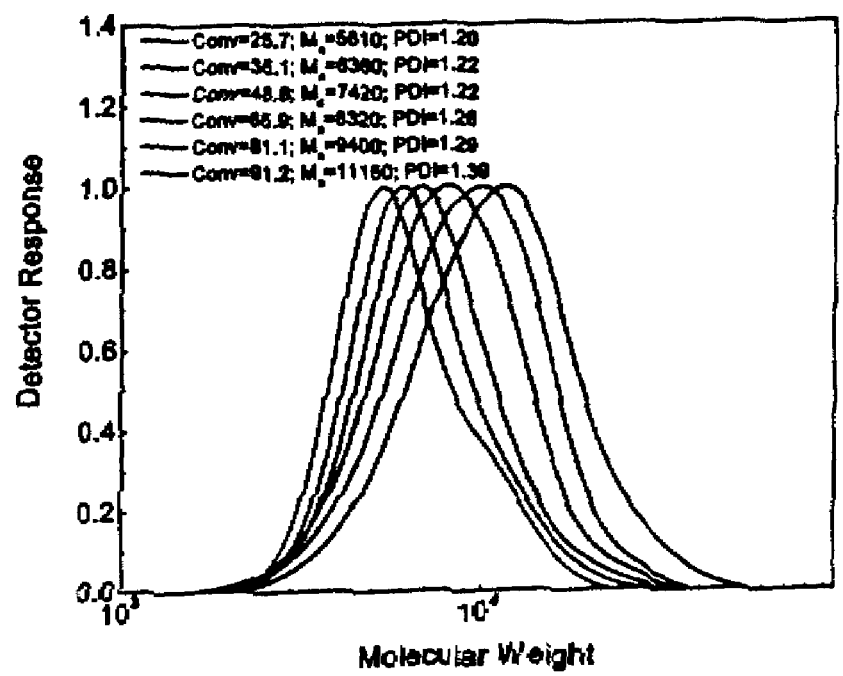
FIG. 26. GPC traces for 2-bromo-3-hexylthiophene polymerization (23-25° C.); $[M]_0$=0.075 mol/L: $[M]_0$:[Ni(dppp)Cl$_2$]=57:1.
Figure 27:
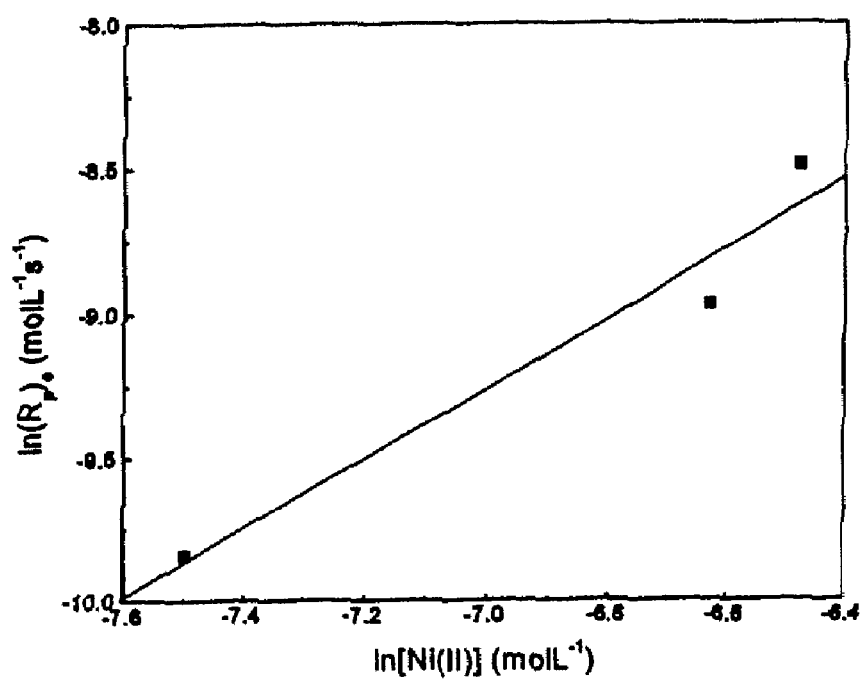
FIG. 27. Plot of the logarithm of the initial rate of polymerization vs. the logarithm of the Ni(dppp)Cl2 concentration.

The molecular weight vs. conversion plot (FIG. 25) and the GPC traces (FIG. 26) show the increase of molecular weight with conversion, providing a further support for the mechanism of the nickel-initiated cross-coupling polymerization being a chain process. The results indicate that the molecular weight of polymer can be predicted by the molar ratio of monomer to Ni(dppp)Cl2 which means that 1 mol of Ni(dppp)Cl2 initiates one polymer chain. In previous work, relatively low concentrations of Ni(dppp)$Cl_2$ was used which leads to higher molecular weights and broad PDIs as illustrated in FIG. 25 (e.g., [M]0:[Ni(dppp)Cl2]=136:1; Mw/Mn ranges from 1.2 to 1.6). When a lower ratio of monomer to initiator is employed, however, one finds a good correlation between the theoretical and observed molecular weights, and narrow PDIs are obtained (e.g., [M]0:[Ni(dppp)Cl2]=49:1; Mw/Mn ranges from about 1.2 to 1.3). FIG. 27 shows the plot of the logarithm of the initial rate of polymerization vs. the logarithm of the Ni(dppp)$Cl_2$ concentration for temperature of 23-25° C.; [M]$_0$=0.075 mol/L.

The present description also refers to the following references which are incorporated by reference in their entirety. While these references may be referred to in the practice of the present invention, no admission is made that any of these references are prior art.

REFERENCES

1. Skotheim, T., *Handbook of Conducting Polymers*. ed.; Marcel Dekker: New York, 1986.
2. Skotheim, T.; Reynolds, J.; Elsembauer, R., *Handbook of Conducting Polymers*. ed.; Marcel Dekker: New York, 1998.
3. Nalwa, H. S., *Handbook of Organic Conductive Molecules and Polymers*. ed.; J. Wiley & Sons: New York, 1996.
4. Heuer, H. W.; Wehrmann, R.; Kirchmeyer, S. *Adv. Funct. Mater.* 2002, 12, 89.
5. De Paoli, M. A.; Nogueira, A. F.; Machado, D. A.; Longo, C. *Electrochim. Acta* 2001, 46, 4243.
6. Groenendaal, L. B.; Zotti, G.; Aubert, P. H.; Waybright, S. M.; Reynolds, J. R. *Adv. Mater.* 2003, 15, 855.
7. Garnier, F.; Yassar, A.; Hjlaoui, R.; Horowitz, G.; Deloffre, F.; Servet, B.; Ries, S.; Alnot, P. *J. Am. Chem. Soc.* 1993, 115, 8716.
8. McCullough, R. D.; Lowe, R. S. *J. Chem. Soc., Chem. Commun.* 1992, 70.
9. McCullough, R. D.; Lowe, R. S.; Jayaraman, M.; Anderson, D. L. *J. Org. Chem.* 1993, 58, 904.
10. Chen, T. A.; Wu, X.; Rieke, R. D. *J. Am. Chem. Soc.* 1995, 117, 233.
11. McCullough, R. D.; Lowe, R. S.; Jayaraman, M.; Ewbank, P. C.; Anderson, D. L.; Tristram-Nagle, S. *Synth. Met.* 1993, 55, 1198.
12. McCullough, R. D.; Williams, S. P.; Tristram-Nagle, S.; Jayaraman, M.; Ewbank, P. C.; Miller, L. *Synth. Met.* 1995, 67, 279.
13. Lowe, R. S.; Khersonsky, S. M.; McCullough, R. D. *Adv. Mater.* 1999, 11, 250.
14. Lowe, R. S.; Ewbank, P. C.; Liu, J.; Zhai, L.; McCullough, R. D. *Macromolecules* 2001, 34, 4324.
15. Diederich, F.; Stang, P. J., *Metal-catalyzed Cross-coupling Reactions*. ed.; Wiley-VCH: Wernheim, Germany, 1998.
16. Tamao, K.; Sumitani, K.; Kumada, M. *J. Am. Chem. Soc.* 1972, 94, 4374.
17. Kumada, M. *Pure Appl. Chem.* 1980, 52, 669.
18. Negishi, E. *Acc. Chem. Res.* 1982, 15, 340.
19. Negishi, E.; Takahashi, T.; Baba, S.; Van Horn, D. E.; Okukado, N. i *J. Am. Chem. Soc.* 1987, 109, 2393.
20. Yamamoto, A.; Yamamoto, T.; Ozawa, F. *Pure Appl. Chem.* 1985, 57, 1799.
21. Ozawa, F.; Hidaka, T.; Yamamoto, T.; Yamamoto, A. *J. Organomet. Chem.* 1987, 330, 253.
22. Yamamoto, T.; Wakabayashi, S.; Osakada, K. *J. Organomet. Chem.* 1992, 428, 223.
23. Parshall, G. W. *J. Am. Chem. Soc.* 1974, 96, 2360.
24. Morrell, D. G.; Kochi, J. K. *J. Am. Chem. Soc.* 1975, 97, 7262.

25. Tsou, T. T.; Kochi, J. K. *J. Am. Chem. Soc.* 1979, 101, 6319.
26. Smith, G.; Kochi, J. K. *J. Organomet. Chem.* 1980, 198, 199.
27. Sheina, E. E.; Liu, J.; Iovu, M. C.; Laird, D. W.; McCullough, R. D. *Macromolecules* 2004, 37, 3526.
28. Yokoyama, A.; Miyakoshi, R.; Yokozawa, T. *Macromolecules* 2004, 37, 1169.
29. Jeffries-EL, M.; Sauvé, G.; McCullough, R. D. *Adv. Mater.* 2004, 16, 1017.
30. Corriu, K. J. P.; Masse, J. P. *J. Chem. Soc., Chem. Commun.* 1972, 144.
31. Chen, T. A.; Rieke, R. D. *J. Am. Chem. Soc.* 1992, 114, 10087.
32. Chen, T. A.; O'Brien, R. A.; Rieke, R. D. *Macromolecules* 1993, 26, 3462.
33. Benn, R.; Mynnot, R.; Topalovic, I.; Scott, F. *Oraganometallics* 1989, 8, 2290.
34. Scott, F.; Kruger, C.; Betz, P. *J. Organomet. Chem.* 1990, 387, 113.
35. Browning, J.; Green, M.; Penfold, B. R.; Spencer, J. L.; Stone, F. G. A. *J. Chem. Soc., Chem. Commun.* 1973, 31.
36. Yue, S.; Berry, G. C.; McCullough, R. D. *Macromolecules* 1996, 29, 933.

What is claimed is:

1. A composition comprising:
   an AB block copolymer, wherein the A block is a regioregular polythiophene, the B block is also a regioregular polythiophene, and the A block is different than the B block, and wherein all of the blocks of the block copolymer are regioregular polythiophene blocks.

2. The composition according to claim 1, wherein the A block and/or the B block regioregular polythiophene is substituted at the 3-position, at the 4-position, or both.

3. The composition according to claim 1, wherein the A block and/or the B block regioregular polythiophene is substituted at the 3-position.

4. The composition according to claim 1, wherein the A block and/or the B block regioregular polythiophene is substituted at the 4-position.

5. The composition according to claim 1, wherein the A block and/or the B block regioregular polythiophene is substituted at the 3-position and the 4-position.

6. The composition according to claim 1, wherein the AB block copolymer has a number average molecular weight of about 25,000 or less.

7. The composition according to claim 1, wherein the AB block copolymer has a polydispersity of about 1.5 or less.

8. The composition according to claim 1, wherein the AB block copolymer is soluble.

9. The composition according to claim 1, wherein the AB block copolymer is soluble, wherein the AB block copolymer has a number average molecular weight of about 25,000 or less, and wherein the AB block copolymer has a polydispersity of about 1.5 or less.

10. The composition according to claim 1, wherein the A block and/or the B block regioregular polythiophene is substituted at the 3-position, at the 4-position, or both, and wherein the AB block copolymer is soluble, wherein the AB block copolymer has a number average molecular weight of about 25,000 or less, and wherein the AB block copolymer has a polydispersity of about 1.5 or less.

11. A composition comprising:
    an ABA block copolymer, wherein the A block is a regioregular polythiophene, the B block is also a regioregular polythiophene, and the A blocks are different than the B block, wherein all of the blocks of the block copolymer are regioregular polythiophene blocks.

12. The composition according to claim 11, wherein the A block and/or the B block regioregular polythiophene is substituted at the 3-position, at the 4-position, or both.

13. The composition according to claim 11, wherein the A block and/or the B block regioregular polythiophene is substituted at the 3-position.

14. The composition according to claim 11, wherein the A block and/or the B block regioregular polythiophene is substituted at the 4-position.

15. The composition according to claim 11, wherein the A block and/or the B block regioregular polythiophene is substituted at the 3-position and the 4-position.

16. The composition according to claim 11, wherein the ABA block copolymer has a number average molecular weight of about 25,000 or less.

17. The composition according to claim 11, wherein the ABA block copolymer has a polydispersity of about 1.5 or less.

18. The composition according to claim 11, wherein the ABA block copolymer is soluble.

19. The composition according to claim 11, wherein the ABA block copolymer is soluble, wherein the ABA block copolymer has a number average molecular weight of about 25,000 or less, and wherein the ABA block copolymer has a polydispersity of about 1.5 or less.

20. The composition according to claim 11, wherein the A block and/or the B block regioregular polythiophene is substituted at the 3-position, at the 4-position, or both, and wherein the ABA block copolymer is soluble, wherein the ABA block copolymer has a number average molecular weight of about 25,000 or less, and wherein the ABA block copolymer has a polydispersity of about 1.5 or less.

21. A composition comprising:
    an ABC block copolymer, wherein the A block is a regioregular polythiophene, wherein the B block is also a regioregular polythiophene, wherein the C block is also a regioregular polythiophene, and wherein the A block, the B block, and the C block are different from each other, and wherein all of the blocks of the block copolymer are regioregular polythiophene blocks.

22. A transistor comprising the composition according to claim 1.

23. A light emitting diode comprising the composition according to claim 1.

24. A photovoltaic device comprising the composition according to claim 1.

25. A sensor comprising the composition according to claim 1.

26. A field effect transistor comprising the composition according to claim 1.

27. A composition comprising:
    a block copolymer comprising at least two different blocks, wherein at least two of the blocks are regioregular polythiophene blocks which are different from each other and wherein all of the blocks of the block copolymer are regioregular polythiophene blocks.

28. The composition according to claim 27, wherein the block copolymer is an AB, an ABA, or an ABC block copolymer.

* * * * *